United States Patent
Wang et al.

(10) Patent No.: US 11,048,849 B2
(45) Date of Patent: Jun. 29, 2021

(54) INTEGRATED CIRCUIT AND METHOD OF MANUFACTURING THE SAME

(71) Applicant: TAIWAN SEMICONDUCTOR MANUFACTURING COMPANY LTD., Hsinchu (TW)

(72) Inventors: Pochun Wang, Hsinchu (TW); Ting-Wei Chiang, New Taipei (TW); Hui-Zhong Zhuang, Kaohsiung (TW); Yu-Jung Chang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 16 days.

(21) Appl. No.: 16/659,270

(22) Filed: Oct. 21, 2019

(65) Prior Publication Data

US 2020/0134123 A1 Apr. 30, 2020

Related U.S. Application Data

(60) Provisional application No. 62/753,279, filed on Oct. 31, 2018.

(51) Int. Cl.

| | |
|---|---|
| *G06F 30/392* | (2020.01) |
| *H01L 27/092* | (2006.01) |
| *H03K 19/0948* | (2006.01) |
| *H03K 19/20* | (2006.01) |
| *H01L 23/522* | (2006.01) |
| *H01L 23/528* | (2006.01) |
| *G06F 30/39* | (2020.01) |

(52) U.S. Cl.
CPC ............ *G06F 30/392* (2020.01); *G06F 30/39* (2020.01); *H01L 23/5226* (2013.01); *H01L 23/5283* (2013.01); *H01L 23/5286* (2013.01); *H01L 27/092* (2013.01); *H03K 19/0948* (2013.01); *H03K 19/20* (2013.01)

(58) Field of Classification Search
CPC ..... G06F 30/392; G06F 30/39; H01L 27/092; H01L 23/5226; H01L 23/5286; H01L 23/5283; H01L 21/823475; H01L 27/088; H03K 19/0948; H03K 19/20
See application file for complete search history.

(56) References Cited

U.S. PATENT DOCUMENTS

| | | |
|---|---|---|
| 7,260,442 B2 | 8/2007 | Hwang et al. |
| 9,256,709 B2 | 2/2016 | Yu et al. |
| 2014/0040838 A1 | 2/2014 | Liu et al. |
| 2015/0278429 A1 | 10/2015 | Chang |

*Primary Examiner* — Daniel D Chang
(74) *Attorney, Agent, or Firm* — Hauptman Ham, LLP

(57) ABSTRACT

An integrated circuit includes a first active region, a second active region, a third active region, a first contact and a second contact. The first active region and the second active region are separated from each other in a first direction, and are located on a first level. The third active region is located on the first level and is separated from the second active region in a second direction different from the first direction. The first contact extends in the second direction, overlaps the first active region, and is located on a second level different from the first level. The second contact extends in the first direction and the second direction, overlaps the first contact and the third active region, is electrically coupled to the first contact, and is located on a third level different from the first level and the second level.

20 Claims, 17 Drawing Sheets

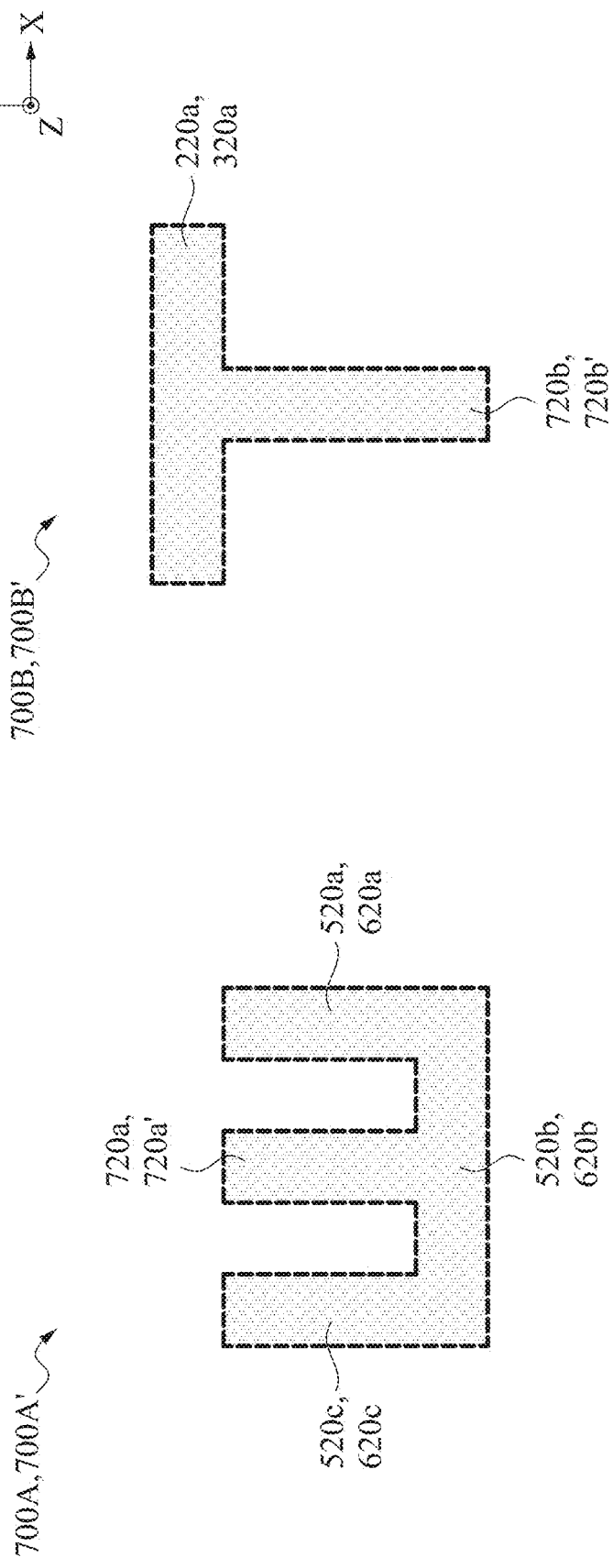

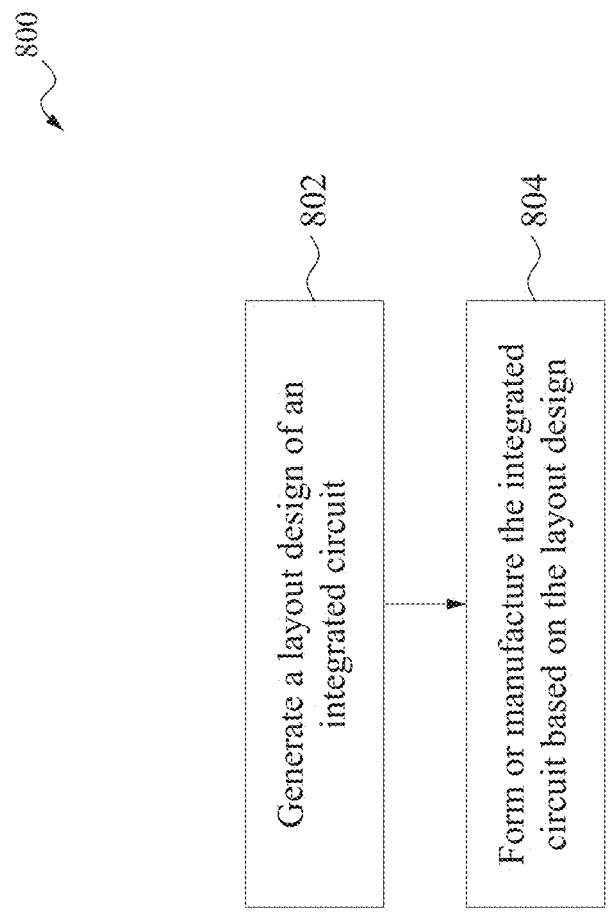

US 11,048,849 B2

INTEGRATED CIRCUIT AND METHOD OF MANUFACTURING THE SAME

PRIORITY CLAIM

This application claims the benefit of U.S. Provisional Application No. 62/753,279, filed Oct. 31, 2018, which is herein incorporated by reference in its entirety.

BACKGROUND

The recent trend in miniaturizing integrated circuits (ICs) has resulted in smaller devices which consume less power yet provide more functionality at higher speeds. The miniaturization process has also resulted in stricter design and manufacturing specifications as well as reliability challenges. Various electronic design automation (EDA) tools generate, optimize and verify standard cell layout designs for integrated circuits while ensuring that the standard cell layout design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7A is a diagram of a layout design of a set of contacts of an integrated circuit, in accordance with some embodiments.

FIG. 7B is a diagram of a layout design of a set of contacts of an integrated circuit, in accordance with some embodiments.

FIG. 7A' is a top view of a diagram of a set of contacts of an integrated circuit, in accordance with some embodiments.

FIG. 7B' is a top view of a diagram of a set of contacts of an integrated circuit, in accordance with some embodiments.

FIG. 8 is a flowchart of a method of forming or manufacturing an integrated circuit, in accordance with some embodiments.

Figure 1:
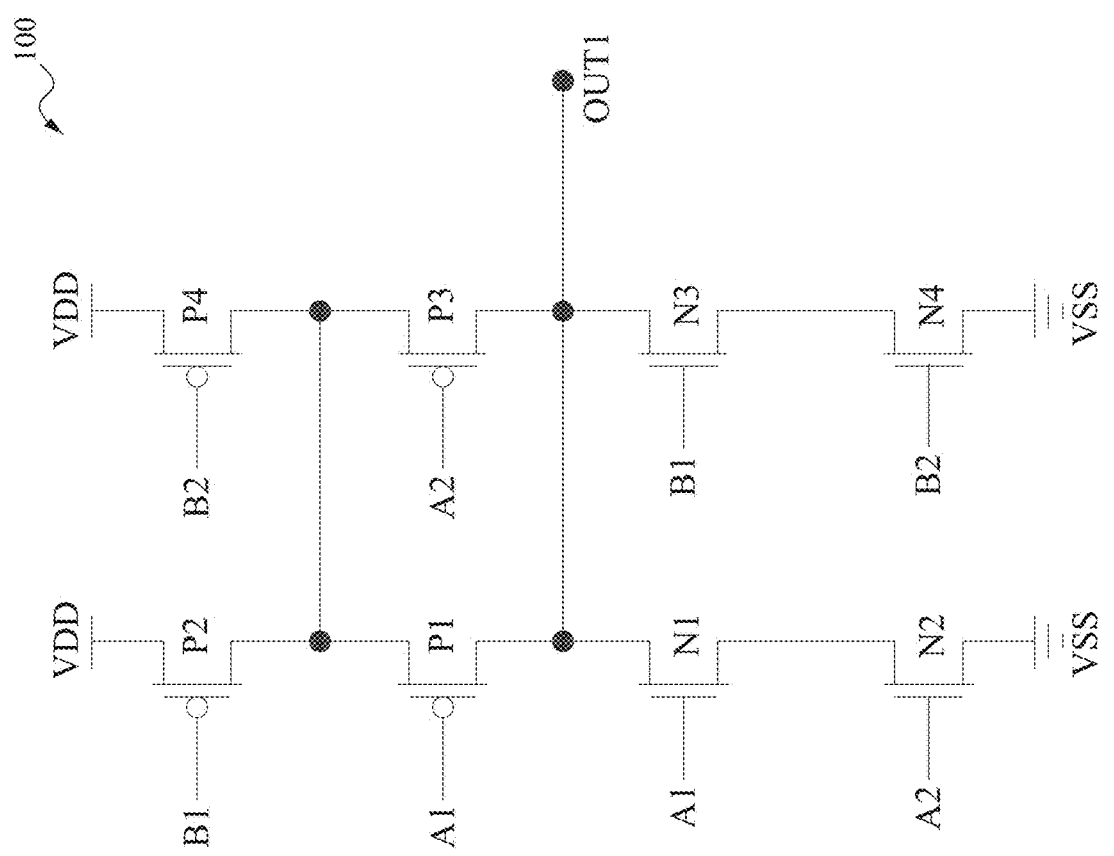
FIG. 1 is a circuit diagram of an integrated circuit, in accordance with some embodiments.

The patent or application file contains drawings/photographs executed in color. Copies of this patent with color drawing(s)/photograph(s) will be provided by the Office upon request and payment of the necessary fee.

DETAILED DESCRIPTION

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, an integrated circuit includes a first active region, a second active region and a third active region, a first contact and a second contact.

In some embodiments, the first active region and the second active region are separated from each other in a first direction, are located on a first level and are in a substrate. In some embodiments, the third active region is in the substrate, located on the first level and is separated from the second active region in a second direction different from the first direction. In some embodiments, the first contact extends in the second direction, overlaps the first active region, and is located on a second level different from the first level.

In some embodiments, the second contact extends in the first direction and the second direction, and is located on a third level different from the first level and the second level. In some embodiments, the second contact overlaps the first contact, the second active region and the third active region.

In some embodiments, the integrated circuit further includes a first insulating region over the second active region and below the second contact, thereby electrically insulating the second active region from the second contact.

In some embodiments, by positioning the first insulating region between the second contact and the second active region, and extending the second contact in each of the first direction X and the second direction Y (e.g., 2 directions), the second contact can provide additional routing resources below upper metallization levels (e.g., M0, M1, etc.) for the integrated circuit. In some embodiments, by providing additional routing resources below upper metallization levels (e.g., M0, M1, etc.), the use of the upper metallization levels (e.g., M0, M1, etc.) can be reduced or the upper metallization levels (e.g., M0, M1, etc.) can be utilized as additional routing resources resulting in an integrated circuit having at least a reduced pitch, a smaller area or a smaller standard cell than other approaches.

Integrated Circuit

FIG. 1 is a circuit diagram of an integrated circuit 100, in accordance with some embodiments. In some embodiments, integrated circuit 100 is a 2-2 AND OR INVERT (AOI) circuit. A 2-2 AOI circuit is used for illustration, other types of circuits including other types of AOI circuits are within the scope of the present disclosure.

Integrated circuit 100 includes P-type metal oxide semiconductor (PMOS) transistors P1, P2, P3 and P4 and N-type metal oxide semiconductor (NMOS) transistors N1, N2, N3 and N4.

A gate terminal of PMOS transistor P1 is configured as an input node (not labelled) configured to receive an input signal A1. A gate terminal of NMOS transistor N1 is configured as an input node (not labelled) configured to receive input signal A1. In some embodiments, the gate terminal of PMOS transistor P1 is coupled to the gate terminal of NMOS transistor N1.

A gate terminal of PMOS transistor P2 is configured as an input node (not labelled) configured to receive an input signal B1. A gate terminal of NMOS transistor N3 is configured as an input node (not labelled) configured to receive input signal B1. In some embodiments, the gate terminal of PMOS transistor P2 is coupled to the gate terminal of NMOS transistor N3.

A gate terminal of PMOS transistor P3 is configured as an input node (not labelled) configured to receive an input signal A2. A gate terminal of NMOS transistor N2 is configured as an input node (not labelled) configured to receive input signal A2. In some embodiments, the gate terminal of PMOS transistor P3 is coupled to the gate terminal of NMOS transistor N2.

A gate terminal of PMOS transistor P4 is configured as an input node (not labelled) configured to receive an input signal B2. A gate terminal of NMOS transistor N4 is configured as an input node (not labelled) configured to receive input signal B2. In some embodiments, the gate terminal of PMOS transistor P4 is coupled to the gate terminal of NMOS transistor N4. In some embodiments, at least input signal A1, A2, B1 or B2 is a logically low signal or a logically high signal.

A source terminal of PMOS transistor P2 and a source terminal of PMOS transistor P4 are coupled to the voltage supply VDD. In some embodiments, the source terminal of PMOS transistor P2 and the source terminal of PMOS transistor P4 are coupled together.

A drain terminal of PMOS transistor P2, a source terminal of PMOS transistor P1, a drain terminal of PMOS transistor P4, and a source terminal of PMOS transistor P3 are coupled to each other.

A drain terminal of PMOS transistor P1, a drain terminal of PMOS transistor P3, a drain terminal of NMOS transistor N1 and a drain terminal of NMOS transistor N3 are coupled to each other, and are configured as an output node OUT1.

A source terminal of NMOS transistor N1 and a drain terminal of NMOS transistor N2 are coupled to each other. A source terminal of NMOS transistor N3 and a drain terminal of NMOS transistor N4 are coupled to each other.

A source terminal of NMOS transistor N2 and a source terminal of NMOS transistor N4 are each coupled to a reference voltage supply VSS. In some embodiments, the source terminal of NMOS transistor N2 and the source terminal of NMOS transistor N4 are coupled together.

Other circuits, other types of transistors, and/or quantities of transistors are within the scope of various embodiments. For example, in some embodiments, integrated circuit 100 includes other types of AOI logic circuits, such as a 2-1 AOI logic circuit. Other values of at least input signal A1, A2, B1 or B2 are within the scope of various embodiments.

Layout Design of an Integrated Circuit

Figure 2:
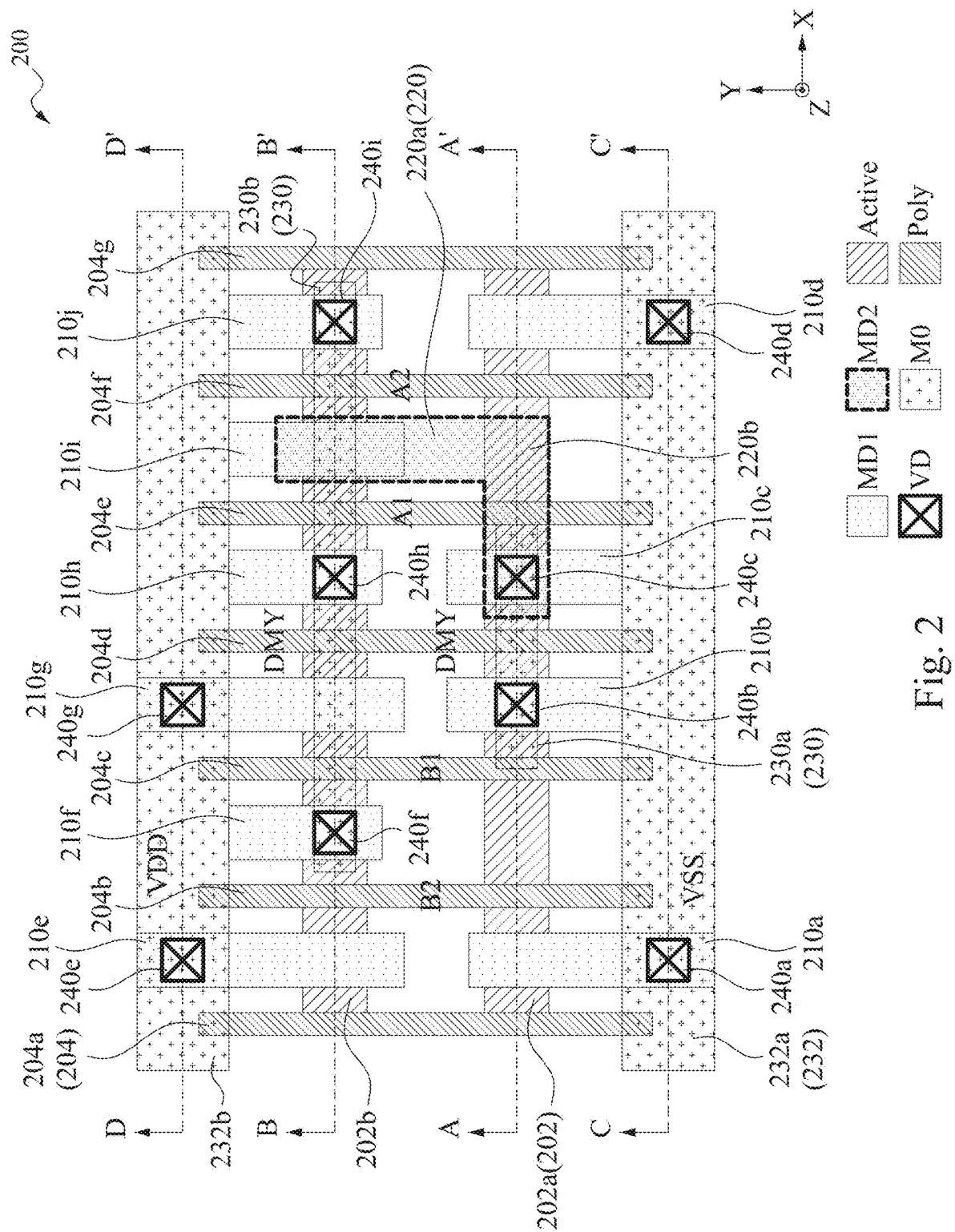
FIG. 2 is a diagram of a layout design of an integrated circuit, in accordance with some embodiments.

FIG. 2 is a diagram of a layout design 200 of an integrated circuit, in accordance with some embodiments. Layout design 200 is a layout diagram of integrated circuit 100 of FIG. 1.

Components that are the same or similar to those in each of FIGS. 2-11 are given the same reference numbers, and detailed description thereof is thus omitted.

Layout design 200 is usable to manufacture integrated circuit 100 of FIG. 1 or integrated circuit 300 of FIGS. 3A-3D.

Layout design 200 includes active region layout patterns 202*a* and 202*b* (collectively referred to as a "set of active region layout patterns 202") extending in a first direction X. Active region layout patterns 202*a*, 202*b* of the set of active region layout patterns 202 are separated from one another in a second direction Y different from the first direction X. The set of active region layout patterns 202 is usable to manufacture a corresponding set of active regions 302 (FIGS. 3A-3B) of integrated circuit 300. In some embodiments, active region layout pattern 202*a*, 202*b* of the set of active region layout patterns 202 is usable to manufacture corresponding active regions 302*a*, 302*b* of the set of active regions 302 (FIGS. 3A-3B) of integrated circuit 300. In some embodiments, the set of active region layout patterns 202 is referred to as an oxide diffusion (OD) region which defines the source or drain diffusion regions of integrated circuit 300.

In some embodiments, active region layout pattern 202*a* of the set of active region layout patterns 202 is usable to manufacture source and drain regions of NMOS transistors N1, N2, N3 and N4, and active region layout pattern 202*b* of the set of active region layout patterns 202 are usable to manufacture source and drain regions of PMOS transistors P1, P2, P3 and P4 of integrated circuit 100 (FIG. 1).

In some embodiments, the set of active region layout patterns 202 is located on a first level. In some embodiments, the first level corresponds to an active level or an OD level of one or more of layout designs 200 or 500 (FIGS. 2 or 5) or integrated circuit 300 or 600 (FIGS. 3A-3D or 6A-6D).

Other configurations or quantities of patterns in the set of active region layout patterns 202 are within the scope of the present disclosure.

Layout design 200 further includes at least gate layout pattern 204*a*, 204*b*, 204*c*, 204*d*, 204*e*, 204*f* or 204*g* (collectively referred to as a "set of gate layout patterns 204") extending in the second direction Y. The set of gate layout patterns 204 of layout design 200 and integrated circuit 300 have a contact poly pitch (CPP) of 6.

Each of the gate layout patterns of the set of gate layout patterns 204 is separated from an adjacent gate layout pattern of the set of gate layout patterns 204 in the first direction X by a first pitch (not labelled). The set of gate layout patterns 204 is usable to manufacture a corresponding set of gates 304 (FIGS. 3A-3D) of integrated circuit 300. In some embodiments, gate layout pattern 204a, 204b, 204c, 204d, 204e, 204f, 204g of the set of gate layout patterns 204 is usable to manufacture corresponding gate 304a, 304b, 304c, 304d, 304e, 304f, 304g of the set of gates 304 (FIGS. 3A-3D) of integrated circuit 300. In some embodiments, at least gate layout pattern 204a, 204d or 204g is a dummy gate layout pattern. In some embodiments, a dummy gate layout pattern is usable to manufacture a corresponding dummy gate. In some embodiments, at least gate 304a, 304d or 304g is a dummy gate. In some embodiments, a dummy gate is a gate structure of a non-functional transistor device.

The set of gate layout patterns 204 are positioned on a first portion of a second level. In some embodiments, the first portion of the second level is different from the first level. In some embodiments, the first portion of the second level corresponds to a POLY layer of one or more of layout designs 200 or 500 (FIGS. 2 or 5) or integrated circuit 300 or 600 (FIGS. 3A-3D or 6A-6D).

The set of active region layout patterns 202 is below the set of gate layout patterns 204.

For clarity, gate layout patterns 204b, 204c, 204e and 204f are labeled with corresponding input signals B2, B1, A1 and A2 of FIG. 1.

Gate layout pattern 204b is usable to manufacture the gate terminal of PMOS transistor P4 and the gate terminal of NMOS transistor N4 of FIG. 1. Gate layout pattern 204c is usable to manufacture the gate terminal of PMOS transistor P2 and the gate terminal of NMOS transistor N3 of FIG. 1. Gate layout pattern 204e is usable to manufacture the gate terminal of PMOS transistor P1 and the gate terminal of NMOS transistor N1 of FIG. 1. Gate layout pattern 204f is usable to manufacture the gate terminal of PMOS transistor P3 and the gate terminal of NMOS transistor N2 of FIG. 1.

Other configurations, arrangements on other levels or quantities of patterns in the set of gate layout patterns 204 are within the scope of the present disclosure.

Layout design 200 further includes at least metal over diffusion layout pattern 210a, 210b, 210c, 210d, 210e, 210f, 210g, 210h, 210i or 210j (collectively referred to as a "set of metal over diffusion layout patterns 210") extending in the second direction Y. At least one of the layout patterns of the set of metal over diffusion layout patterns 210 overlaps the set of active region layout patterns 202. The layout patterns of the set of metal over diffusion layout patterns 210 are separated from an adjacent layout pattern of the set of metal over diffusion layout patterns 210 in at least the first direction X or the second direction Y. In some embodiments, the set of metal over diffusion layout patterns 210 is located on a second portion of the second level. In some embodiments, the second portion of the second level corresponds to a metal over diffusion one (MD1) level of one or more of layout designs 200 or 500 (. 2 or 5) or integrated circuit 300 or 600 (FIGS. 3A-3D or 6A-6D). In some embodiments, the first portion of the second level is the same as the second portion of the second level. In some embodiments, the second level includes an MD1 portion and a POLY portion.

The set of metal over diffusion layout patterns 210 is usable to manufacture a corresponding set of contacts 310 (FIGS. 3A-3D) of integrated circuit 300. In some embodiments, metal over diffusion layout patterns 210a, 210b, 210c, 210d, 210e, 210f, 210g, 210h, 210i, 210j of the set of metal over diffusion layout patterns 210 is usable to manufacture corresponding contacts 310a, 310b, 310c, 310d, 310e, 310f, 310g, 310h, 310i, 310j of the set of contacts 310 (FIGS. 3A-3D) of integrated circuit 300.

In some embodiments, each of the layout patterns of the set of metal over diffusion layout patterns 210 have a regular layout pattern. In some embodiments, regular layout patterns are layout patterns that are aligned in at least a single direction with respect to each other. In some embodiments, regular layout patterns are layout patterns aligned in at least the first direction X or the second direction Y.

Other configurations, arrangements on other levels or quantities of patterns in the set of metal over diffusion layout patterns 210 are within the scope of the present disclosure.

Layout design 200 further includes at least metal over diffusion layout pattern 220a or 220b (collectively referred to as a "set of metal over diffusion layout patterns 220"). The set of metal over diffusion layout patterns 220 extends in the first direction X and the second direction Y. In some embodiments, set of metal over diffusion layout patterns 220 is referred to as a two dimensional (2D) layout pattern. In some embodiments, the set of metal over diffusion layout patterns 220 has an L-shape. In some embodiments, the set of metal over diffusion layout patterns 220 has one or more of a U-shape similar to a set of metal over diffusion layout patterns 520 of FIG. 5, a W shape similar to a set of metal over diffusion layout patterns 700A of FIG. 7A, a T-shape similar to a set of metal over diffusion layout patterns 700B of FIG. 7B, an O-shape (not shown), or the like. Other shapes in the set of metal over diffusion layout patterns 220 are within the scope of the present disclosure.

Metal over diffusion layout pattern 220a extends in the second direction Y. Metal over diffusion layout pattern 220b extends in the first direction X. In some embodiments, metal over diffusion layout patterns 220a and 220b are portions of a same continuous layout pattern (e.g., set of metal over diffusion layout patterns 220).

In some embodiments, the set of metal over diffusion layout patterns 220 includes two or more separate or discontinuous layout patterns that are separated from each other in at least the first direction X or the second direction Y.

At least one of the layout patterns of the set of metal over diffusion layout patterns 220 overlaps at least one of the set of active region layout patterns 202 or at least one of the set of metal over diffusion layout patterns 210. Metal over diffusion layout pattern 220a overlaps metal over diffusion layout pattern 210i and active region layout pattern 202b. Metal over diffusion layout pattern 220b overlaps metal over diffusion layout pattern 210c and active region layout pattern 202a.

The set of metal over diffusion layout patterns 220 is located on a third level. In some embodiments, the third level is different from the first level and the second level. In some embodiments, the third level is different from the first portion of the second level and the second portion of the second level.

In some embodiments, the third level corresponds to a metal over diffusion two (MD2) level of one or more of layout designs 200 or 500 (FIGS. 2 or 5) or integrated circuit 300 or 600 (FIGS. 3A-3D or 6A-6D). In some embodiments, the MD2 level is above the MD1 level or the POLY1 level. The set of metal over diffusion layout patterns 220 is usable to manufacture a corresponding set of contacts 320 (FIGS. 3A-3D) of integrated circuit 300.

In some embodiments, metal over diffusion layout patterns 220a, 220b of the set of metal over diffusion layout patterns 220 is usable to manufacture corresponding contact portions 320a, 320b of the set of contacts 320 (FIGS. 3A-3D) of integrated circuit 300.

In some embodiments, at least metal over diffusion layout pattern 210i or a portion of metal over diffusion layout pattern 220a is usable to manufacture the drain terminal of PMOS transistor P2 of FIG. 1 and the drain terminal of PMOS transistor P3 of FIG. 1.

In some embodiments, at least metal over diffusion layout pattern 210c or a portion of metal over diffusion layout pattern 220b is usable to manufacture the drain terminal of NMOS transistor N1 of FIG. 1.

In some embodiments, at least metal over diffusion layout pattern 220a or 220b is usable to manufacture one or more drain or source terminals of at least NMOS transistor N1, N2, N3 or N4 or PMOS transistor P1, P2, P3 or P4 of FIG. 1.

Other configurations, arrangements on other levels, shapes or quantities of patterns in the set of metal over diffusion layout patterns 220 are within the scope of the present disclosure.

Layout design 200 further includes at least conductive feature layout pattern 230a or 230b (collectively referred to as a "set of conductive feature layout patterns 230") extending in the first direction X. The set of conductive feature layout patterns 230 is usable to manufacture a corresponding set of conductive structures 330 (FIGS. 3A-3D) of integrated circuit 300. In some embodiments, conductive feature layout patterns 230a, 230b of the set of conductive feature layout patterns 230 is usable to manufacture corresponding conductive structures 330a, 330b of the set of conductive structures 330 (FIGS. 3A-3D) of integrated circuit 300.

The set of conductive feature layout patterns 230 overlap at least the set of metal over diffusion layout patterns 210 or the set of metal over diffusion layout patterns 220. The set of conductive feature layout patterns 230 are over the set of active region layout patterns 202.

Conductive feature layout pattern 230a overlaps metal over diffusion layout patterns 210b and 210c, and metal over diffusion layout pattern 220b. Conductive feature layout pattern 230a is over active region layout pattern 202a. In some embodiments, conductive feature layout pattern 230a extends between gate layout pattern 204c and 204e.

Conductive feature layout pattern 230b overlaps metal over diffusion layout patterns 210f, 210g, 210h, 210i and 210j, and metal over diffusion layout pattern 220a. Conductive feature layout pattern 230b is over active region layout pattern 202b. In some embodiments, conductive feature layout pattern 230b extends between gate layout pattern 204b and 204g.

The set of conductive feature layout patterns 230 is located on a fourth level. In some embodiments, the fourth level is different from at least the first level, the second level or the third level. In some embodiments, the fourth level corresponds to a metal zero (M0) layer of one or more of layout designs 200 or 500 (FIGS. 2 or 5) or integrated circuit 300 or 600 (FIGS. 3A-3D or 6A-6D). Other levels are within the scope of the present disclosure.

Other configurations, arrangements on other levels or quantities of patterns in the set of conductive feature layout patterns 230 are within the scope of the present disclosure.

Layout design 200 further includes one or more power rail layout patterns 232a or 232b (collectively referred to as a "set of power rail layout patterns 232") extending in the first direction X, and being located on the fourth level. The set of power rail layout patterns 232 is usable to manufacture a set of power rails 332 of integrated circuit 300 (FIGS. 3A-3D) or set of power rails 632 of integrated circuit 600 (FIGS. 6A-6D). In some embodiments, power rail layout patterns 232a, 232b of the set of power rail layout patterns 232 is usable to manufacture corresponding power rails 332a, 332b of the set of power rails 332 (FIG. 3) of integrated circuit 300. In some embodiments, power rail layout patterns 232a, 232b of the set of power rail layout patterns 232 is usable to manufacture corresponding power rails 632a, 632b of the set of power rails 632 (FIG. 6) of integrated circuit 600.

The set of power rail layout patterns 232 overlaps one or more layout patterns of the set of metal over diffusion layout patterns 210. In some embodiments, power rail layout pattern 232a overlaps at least metal over diffusion layout pattern 210a or 210d. In some embodiments, power rail layout pattern 232b overlaps at least metal over diffusion layout pattern 210e, 210g or 210i.

In some embodiments, the set of power rails 332 or 632 is configured to provide a first supply voltage of a voltage supply VDD or a second supply voltage of a reference voltage supply VSS to the integrated circuit, such as integrated circuit 300 or 600. In some embodiments, each power rail layout pattern of the set of power rail layout patterns 232 is located along a corresponding edge of a cell of layout design 200. In some embodiments, layout design 300 corresponds to a standard cell.

Other configurations, arrangements on other levels or quantities of patterns in the set of power rail layout patterns 232 are within the scope of the present disclosure.

Layout design 200 further includes at least via layout pattern 240a, 240b, 240c, 240d, 240e, 240f, 240g, 240h or 240i (collectively referred to as a "set of via layout patterns 240"). The set of via layout patterns 240 is usable to manufacture a corresponding set of vias 340 (FIGS. 3A-3D). In some embodiments, via layout patterns 240a, 240b, 240c, 240d, 240e, 240f, 240g, 240h, 240i of the set of via layout patterns 240 is usable to manufacture corresponding vias 340a, 340b, 340c, 340d, 340e, 340f, 340g, 340h, 340i of the set of vias 340 (FIGS. 3A-3D) of integrated circuit 300.

In some embodiments, the set of via layout patterns 240 are between at least the set of conductive feature layout patterns 230 or the set of power rail layout patterns 232 and at least the set of metal over diffusion layout patterns 210 or 220.

Set of via layout patterns 240 are positioned at a via over diffusion (VD) level or a tall via over diffusion (VDT) of one or more of layout designs 200 or 500 (FIGS. 2 or 5) or integrated circuit 300 or 600 (FIGS. 3A-3D or 6A-6D).

In some embodiments, the VD level is between the M0 level and the MD2 level. In some embodiments, the VDT level is between the M0 level and the MD1 level. In some embodiments, the MD2 level is above the MD1 level or the POLY1 level. In some embodiments, the VDT level is between the fourth level and the second portion of the second level (e.g., MD1). In some embodiments, the VD level is between the fourth level and the third level (e.g., MD2). Other levels are within the scope of the present disclosure.

Via layout patterns 240a, 240d are between power rail layout pattern 232a and corresponding metal over diffusion layout patterns 210a, 210d. Via layout patterns 240e, 240g are between power rail layout pattern 232b and corresponding metal over diffusion layout patterns 210e, 210g.

Via layout pattern 240b is between conductive feature layout pattern 230a and metal over diffusion layout pattern 210b. Via layout pattern 240c is between conductive feature layout pattern 230a and metal over diffusion layout pattern 220b. Via layout pattern 240f, 240h, 240i is between conductive feature layout pattern 230b and corresponding metal over diffusion layout pattern 210f, 210h, 210j.

In some embodiments, at least one layout pattern of the set of metal over diffusion layout patterns 220 is not included in layout design 200; therefore, a corresponding via layout pattern of the set of via layout patterns 240, over the removed layout pattern of the set of metal over diffusion layout patterns 220, is positioned at the VDT level.

Other configurations, arrangements on other levels or quantities of patterns in the set of via layout patterns 240 are within the scope of the present disclosure. For example, in some embodiments, the set of via layout patterns 240 are positioned between the set of metal over diffusion layout patterns 220 and the set of gate layout patterns 204, and therefore the set of via layout patterns 240 are usable to manufacture a corresponding set of vias 340 that are configured to provide an electrical connection between the set of gates 304 and the set of contacts 220.

In some embodiments, by extending the set of metal over diffusion layout patterns 220 in the first direction X and the second direction Y (e.g., 2 directions) and by positioning the set of metal over diffusion layout patterns 220 to overlap at least the set of metal over diffusion layout patterns 210, the set of gate layout patterns 204 or the set of active regions 202, the set of metal over diffusion layout patterns 220 provide additional routing resources in the second direction Y and located below upper metallization layers (e.g., M0, M1, etc.) in layout design 200. By providing routing resources below upper metallization levels (e.g., M0, M1, etc.), the use of the upper metallization layers (e.g., M0, M1, etc.) can be reduced or the upper metallization layers (e.g., M0, M1, etc.) can be utilized as additional routing resources resulting in layout design 200 having at least a reduced pitch, a smaller area or a smaller standard cell than other approaches.

Layout design 200 or 500 (FIG. 5) have a height H1 (not labelled) in the second direction Y. In some embodiments, layout design 200 and 500 (FIG. 5) are referred to as a single height standard cell.

Integrated Circuit

FIGS. 3A, 3B, 3C and 3D are diagrams of an integrated circuit 300, in accordance with some embodiments.

Figure 3A:
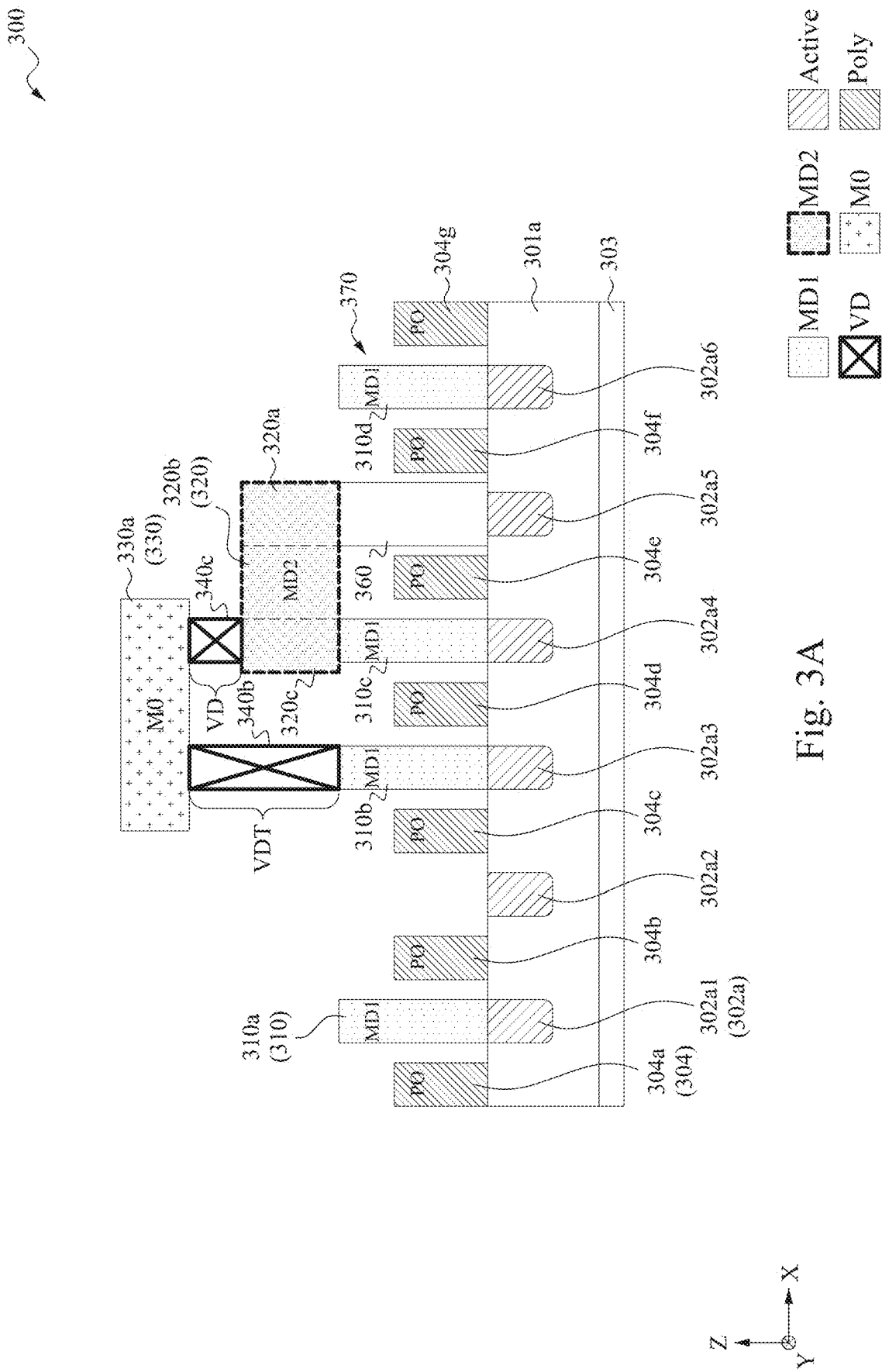
FIGS. 3A, 3B, 3C and 3D are diagrams of an integrated circuit, in accordance with some embodiments.
Figure 3B:
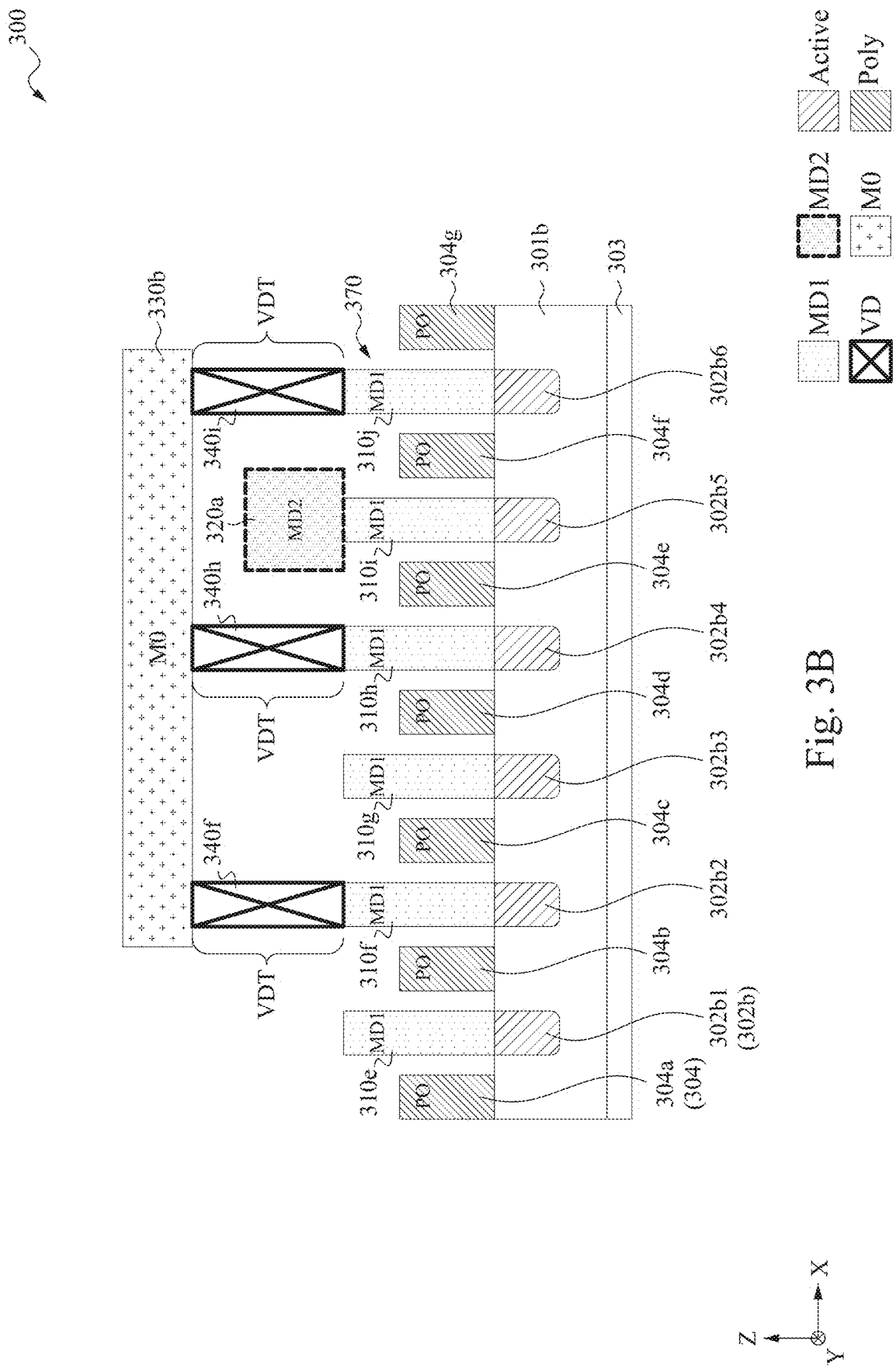
Figure 3C:
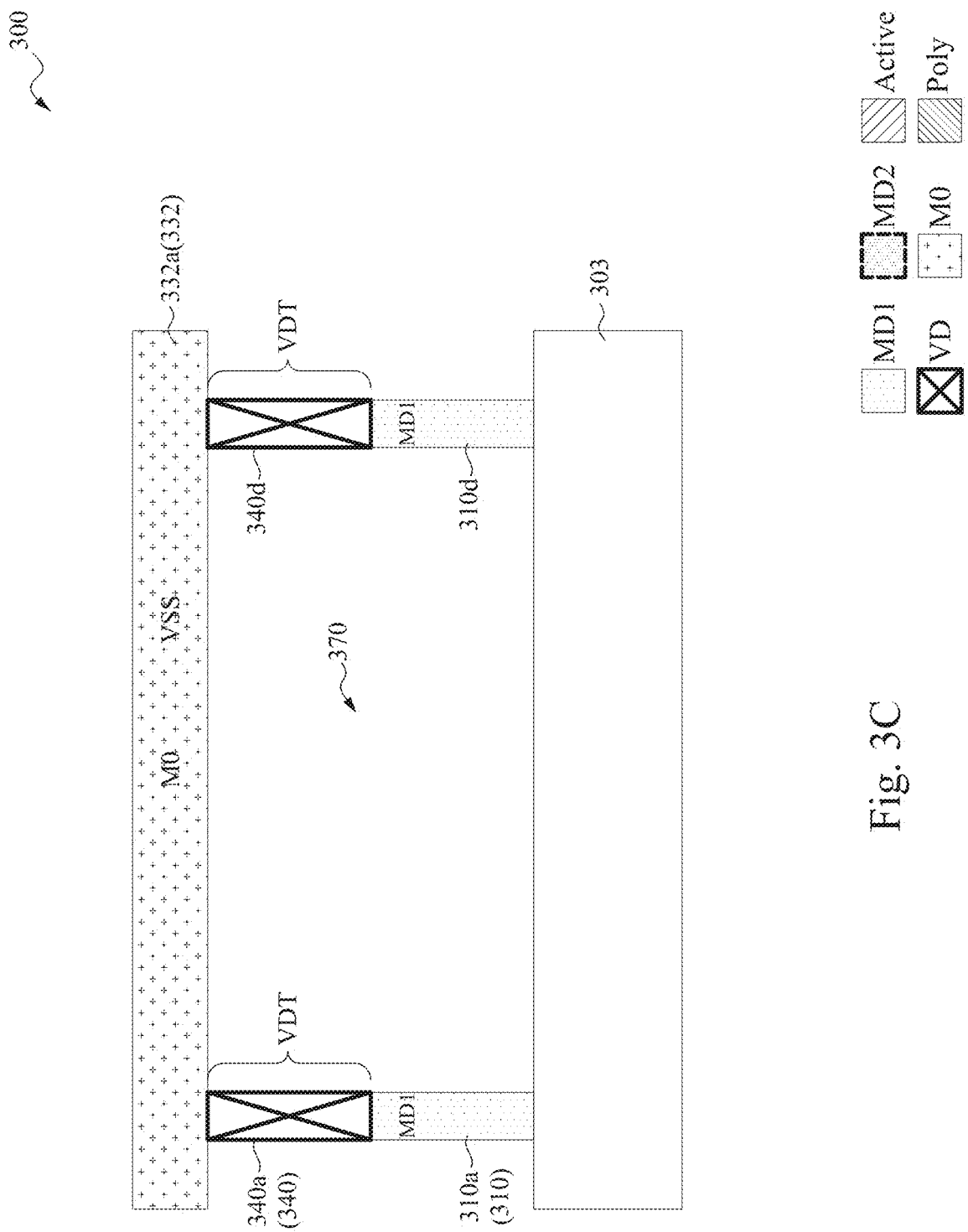
Figure 3D:
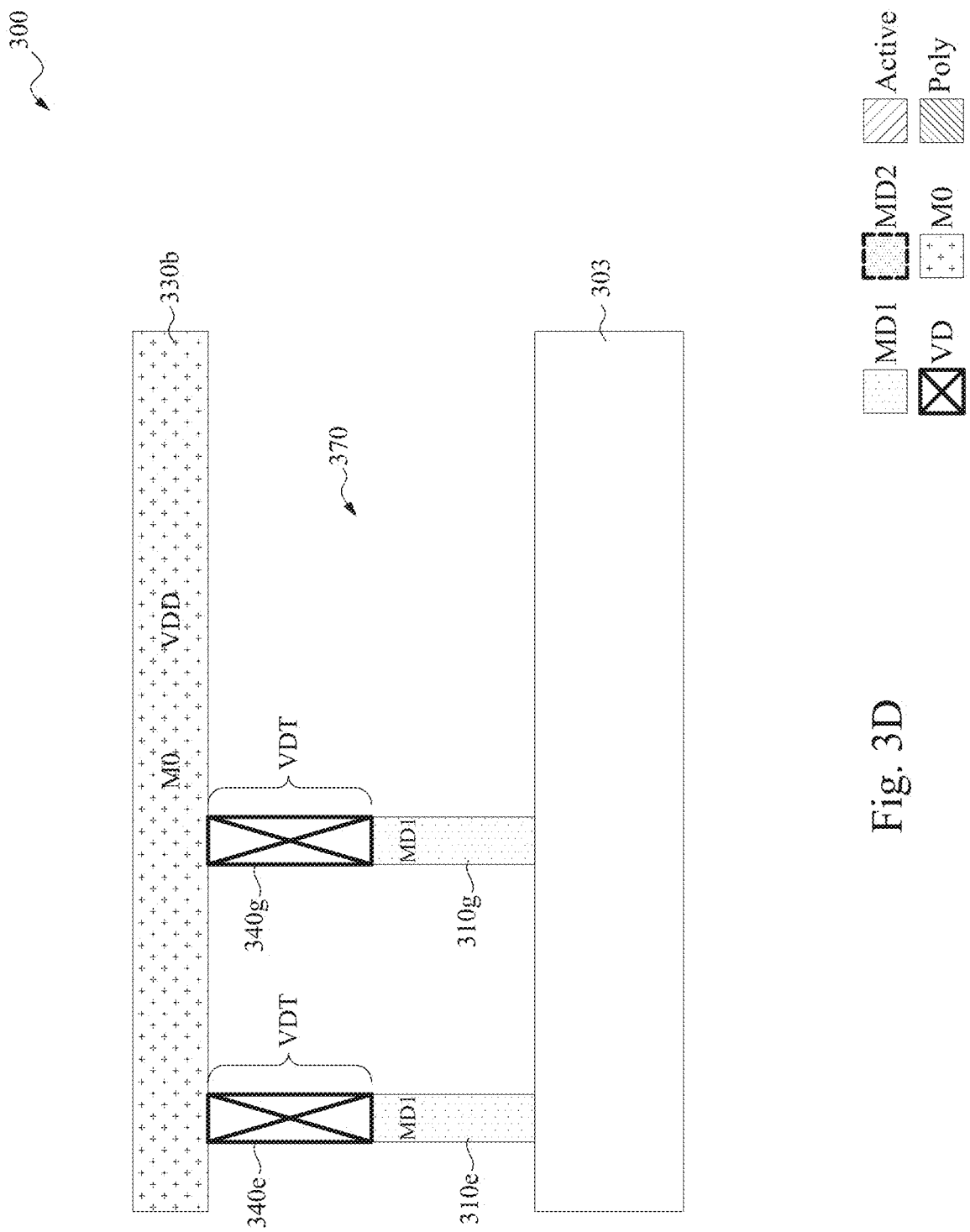

FIG. 3A is a cross-sectional view of an integrated circuit 300 corresponding to layout design 200 as intersected by plane A-A', in accordance with some embodiments. FIG. 3B is a cross-sectional view of an integrated circuit 300 corresponding to layout design 200 as intersected by plane B-B', in accordance with some embodiments. FIG. 3C is a cross-sectional view of an integrated circuit 300 corresponding to layout design 200 as intersected by plane C-C', in accordance with some embodiments. FIG. 3D is a cross-sectional view of an integrated circuit 300 corresponding to layout design 200 as intersected by plane D-D', in accordance with some embodiments.

Integrated circuit 300 is manufactured by layout design 200. Integrated circuit 300 is an embodiment of a portion of integrated circuit 100.

Structural relationships including alignment, lengths and widths, as well as configurations of integrated circuit 300 are similar to the structural relationships and configurations of layout design 200 of FIG. 2, and similar detailed description will not be described in FIGS. 3A-3D for brevity.

Integrated circuit 300 includes a well region 301a, a well region 301b, the set of active regions 302, a substrate 303, the set of gates 304, the set of contacts 310, the set of contacts 320, the set of conductive features 330, the set of rails 332, the set of vias 340 and an insulating region 360.

Well region 301a and well region 301b are in substrate 303. Each of well region 301a and well region 301b is located on at least a first level of integrated circuit 300, and extends in at least the first direction X or the second direction Y. In some embodiments, well region 301a and well region 301b are adjacent to each other, and are separated from each other in the second direction Y. In some embodiments, well region 301a and 301b are separated from each other by an insulating layer (not shown).

In some embodiments, well region 301a includes Si, Ge, SiGe, InAs, InGaAs, InAlAs, InP, or the like. In some embodiments, well region 301b includes Si, Ge, SiGe, InAs, InGaAs, InAlAs, InP, or the like. In some embodiments, substrate 303 includes SiGe, Si, Ge, InAs, InGaAs, InAlAs, InP, or the like.

Well region 301a of integrated circuit 300 is a first type of well. In some embodiments, the first type of well is an N-type of well. In some embodiments, the first type of well is a P-type of well.

Well region 301b of integrated circuit 300 is a second type of well different from the first type of well. In some embodiments, the second type of well is a P-type of well. In some embodiments, the second type of well is an N type of well.

Other quantities or configurations of the well region 301a or the well region 301b are within the scope of the present disclosure.

The set of active regions 302 extends in the second direction Y. The set of active regions 302 is located on the first level of integrated circuit 300. The set of active regions 302 includes a sub-set of active regions 302a and a sub-set of active regions 302b.

The sub-set of active regions 302a includes at least active region 302a1, 302a2, 302a3, 302a4, 302a5 or 302a6. Each of the active regions 302a1, 302a2, 302a3, 302a4, 302a5 and 302a6 of the sub-set of active regions 302a is separated from an adjacent active region of the sub-set of active regions 302a in the first direction X.

Active regions 302a1, 302a2, 302a3, 302a4, 302a5 and 302a6 of the sub-set of active regions 302a are embedded in the well region 301a of integrated circuit 300. Active regions 302a1, 302a2, 302a3, 302a4, 302a5 and 302a6 include dopants of a first dopant type. In some embodiments, the first dopant type is an N-type dopant. In some embodiments, the first dopant type is a P-type dopant.

In some embodiments, active regions 302a1, 302a2, 302a3, 302a4, 302a5 and 302a6 include N-type dopants as the first dopant type, and well region 301a is a P-type of well. In some embodiments, active regions 302a1, 302a2, 302a3, 302a4, 302a5 and 302a6 include P-type dopants as the first dopant type, and well region 301a is an N-type of well.

The sub-set of active regions 302b includes at least active region 302b1, 302b2, 302b3, 302b4, 302b5 or 302b6.

Each of the active regions 302b1, 302b2, 302b3, 302b4, 302b5 and 302b6 of the sub-set of active regions 302b is separated from an adjacent active region of the sub-set of active regions 302b in the first direction X.

Active regions 302b1, 302b2, 302b3, 302b4, 302b5 and 302b6 of the sub-set of active regions 302a are embedded in the well region 301b of integrated circuit 300. Active regions 302b1, 302b2, 302b3, 302b4, 302b5 and 302b6 include dopants of a second dopant type different from the first dopant type.

In some embodiments, the second dopant type is a P-type dopant and the first dopant type is an N-type dopant. In some embodiments, the second dopant type is an N-type dopant and the first dopant type is a P-type dopant.

In some embodiments, active regions 302b1, 302b2, 302b3, 302b4, 302b5 and 302b6 include P-type dopants as the second dopant type, and well region 301*b* is an N-type of well. In some embodiments, active regions 302*b*1, 302*b*2, 302*b*3, 302*b*4, 302*b*5 and 302*b*6 include N-type dopants as the second dopant type, and well region 301*b* is a P-type of well.

In some embodiments, active region 302*a*1 corresponds to the source of NMOS transistor N4. In some embodiments, active region 302*a*2 corresponds to the drain of NMOS transistor N4 and the source of NMOS transistor N3. In some embodiments, active region 302*a*3 corresponds to the drain of NMOS transistor N3.

In some embodiments, active region 302*a*4 corresponds to the drain of NMOS transistor N1. In some embodiments, active region 302*a*5 corresponds to the drain of NMOS transistor N2 and the source of NMOS transistor N1. In some embodiments, active region 302*a*6 corresponds to the source of NMOS transistor N2.

In some embodiments, active region 302*b*1 corresponds to the source of PMOS transistor P4. In some embodiments, active region 302*b*2 corresponds to the drain of PMOS transistor P2 and the drain of PMOS transistor P4. In some embodiments, active region 302*b*3 corresponds to the source of PMOS transistor P2. In some embodiments, active region 302*b*4 corresponds to the source of PMOS transistor P1. In some embodiments, active region 302*b*5 corresponds to the drain of PMOS transistor P1 and the drain of PMOS transistor P3. In some embodiments, active region 302*b*6 corresponds to the source of PMOS transistor P3.

Other configurations, arrangements on other levels or quantities of active regions in the set of active regions 302 are within the scope of the present disclosure.

The set of gates 304 includes at least gate 304*a*, 304*b*, 304*c*, 304*d*, 304*e*, 304*f* or 304*g*. Each of gates 304*a*, 304*b*, 304*c*, 304*d*, 304*e*, 304*f* and 304*g* of the set of gates 304 extends in the second direction Y. The set of gates 304 is positioned on a first portion of a second level of integrated circuit 300.

Gate 304*b* of the set of gates 304 corresponds to the gate terminal of PMOS transistor P4 and the gate terminal of NMOS transistor N4 of FIG. 1. Gate 304*c* of the set of gates 304 corresponds to the gate terminal of PMOS transistor P2 and the gate terminal of NMOS transistor N3 of FIG. 1. Gate 304*e* of the set of gates 304 corresponds to the gate terminal of PMOS transistor P1 and the gate terminal of NMOS transistor N1 of FIG. 1. Gate 304*f* of the set of gates 304 corresponds to the gate terminal of PMOS transistor P3 and the gate terminal of NMOS transistor N2 of FIG. 1. In some embodiments, at least gate 304*a*, 304*d* or 304*g* corresponds to a dummy gate of a corresponding non-functional transistor.

Other configurations, arrangements on other levels or quantities of gates in the set of gates 304 are within the scope of the present disclosure.

The set of contacts includes at least contact 310*a*, 310*b*, 310*c*, 310*d*, 310*e*, 310*f*, 310*g*, 310*h*, 310*i* or 310*j*. Contacts 310*a*, 310*b*, 310*c*, 310*d*, 310*e*, 310*f*, 310*g*, 310*h*, 310*i*, 310*j* of the set of contacts 310 extend in the second direction Y, and overlap corresponding active regions 302*a*1, 302*a*3, 302*a*4, 302*a*6, 302*b*1, 302*b*2, 302*b*3, 302*b*4, 302*b*5, 302*b*6. Contacts 310*a*, 310*b*, 310*c*, 310*d*, 310*e*, 310*f*, 310*g*, 310*h*, 310*i*, 310*j* of the set of contacts 310 are electrically coupled to corresponding active regions 302*a*1, 302*a*3, 302*a*4, 302*a*6, 302*b*1, 302*b*2, 302*b*3, 302*b*4, 302*b*5, 302*b*6. In some embodiments, the set of contacts 310 is located on the second portion of the second level.

Other configurations, arrangements on other levels or quantities of contacts in the set of contacts 310 are within the scope of the present disclosure.

The set of contacts 320 extends in the first direction X and the second direction Y. In some embodiments, set of contacts 320 is referred to as a 2D structure since contact portions 320*a* and 320*b* extend in at least two different directions (e.g., first direction X and the second direction Y). In some embodiments, the set of contacts 320 has an L-shape. In some embodiments, the set of contacts 320 has one or more of a U-shape similar to a set of contacts 620 of FIGS. 6A-6D, a W-shape similar to a set of contacts 700A' of FIG. 7A, a T-shape similar to a set of contacts 700B' of FIG. 7B, an O-shape (not shown), or the like. Other shapes or numbers of portions in the set of contacts 320 or 620 (FIG. 6A-6D) are within the scope of the present disclosure.

The set of contacts 320 includes a contact portion 320*a* and a contact portion 320*b*.

At least one of the contact portions of the set of contacts 320 overlaps at least one of the set of active regions 302 or at least one of the set of contacts 310.

Contact portion 320*a* of the set of contacts 320 extends in the second direction Y. Contact portion 320*b* of the set of contacts 320 extends in the first direction X. In some embodiments, contact portion 320*a* and contact portion 320*b* are part of the same continuous contact structure. In some embodiments, the set of contacts 320 includes two or more separate or discontinuous contact portions that are separated from each other in at least the first direction X or the second direction Y.

Contact portion 320*a* of the set of contacts 320 overlaps contact 310*i* of the set of contacts 310 and an insulating region 360. Contact portion 320*a* overlaps active regions 302*b*5 and 302*a*5. In some embodiments, contact portion 320*a* is directly coupled to contact 310*i* of the set of contacts 310. In some embodiments, contact portion 320*a* is electrically coupled to active region 302*b*5 by contact 310*i*. In some embodiments, contact portion 320*a* is electrically isolated from active region 302*a*5 by the insulating region 360.

Contact portion 320*b* of the set of contacts 320 overlaps contact 310*c* of the set of contacts 310 and insulating region 360. Contact portion 320*b* overlaps active regions 302*a*4 and 302*a*5. In some embodiments, contact portion 320*b* is directly coupled to contact 310*c* of the set of contacts 310. In some embodiments, contact portion 320*b* is electrically coupled to active region 302*a*4 by contact 310*c*. In some embodiments, contact portion 320*b* is electrically isolated from active region 302*a*5 by the insulating region 360. The set of contacts 320 is located on the third level.

In some embodiments, at least one contact in the set of contacts 320 or 620 (FIGS. 6A-6D) includes one or more layers of a conductive material. In some embodiments, the conductive material includes Tungsten, Cobalt, Ruthenium, Copper, or the like or combinations thereof.

In some embodiments, at least one contact portion in the set of contacts 320 or 620 (FIGS. 6A-6D) has a height or thickness (not labelled) in a third direction Z that is less than a height or thickness (not labelled) in the third direction Z of one or more vias in the set of vias 340 or 640 (FIGS. 6A-6D) in the VDT level. In some embodiments, the third direction Z is different from the first direction X and the second direction Y.

Other configurations, arrangements on other levels or quantities of contacts in the set of contacts 320 are within the scope of the present disclosure. For example, in some embodiments, contact portion 320*a*, contact portion 320*b* or other contacts similar to contact portion 320a or 320b in the set of contacts 320 overlap or extend over at least another contact in the MD1 level or a gate in the POLY level of integrated circuit 300 or 600 (FIGS. 6A-6D).

Insulating region 360 is configured to insulate one or more elements in integrated circuit 300 from each other. Insulating region 360 is over active region 302a5. Insulating region 360 is positioned between contact portions 320a and 320b and active region 302a5 thereby electrically insulating contact portions 320a and 320b from active region 302a5. In some embodiments, insulating region 360 is part of a set of insulating layers 370. In some embodiments, at least insulating region 360 or the set of insulating layers 370 is located on the second portion of the second level.

The set of insulating layers 370 extend in the first direction X and the second direction Y. In some embodiments, the set of insulating layers 370 are configured to electrically insulate at least one member of the set of active regions 302, the set of gates 304, the set of contacts 310, the set of contacts 320, the set of conductive structures 330, the set of power rail 332 or the set of vias 340 from at least another one member of the set of active regions 302, the set of gates 304, the set of contacts 310, the set of contacts 320, the set of conductive structures 330, the set of power rail 332 or the set of vias 340.

In some embodiments, insulating region 360 or the set of insulating layers 370 is over active regions of the set of active regions 302 different from active region 302a5, and insulating region 360 or the set of insulating layers 370 electrically isolate the corresponding one or more other active regions from other overlying layers (e.g., contacts in the MD2 layer). For example, in some embodiments, insulating region 360 or the set of insulating layers 370 can replace one or more contacts of the set of contacts 310 or 610 (FIGS. 6A-6D), similar to insulating region 360 shown in FIG. 3A.

In some embodiments, insulating region 360 or the set of insulating layers 370 are positioned over one or more gates of the set of gates 304 and insulating region 360 or the set of insulating layers 370 electrically isolate the corresponding one or more gates from other overlying layers (e.g., contacts in the MD2 layer).

In some embodiments, at least insulating region 360, 660 or 662 (FIGS. 6A-6D) or a layer of the set of insulating layers 370 or 670 (FIGS. 6A-6D) includes one or more layers of a dielectric material. In some embodiments, the dielectric material includes SiOCN, $SiO_2$, SiOC, or the like or combinations thereof.

In some embodiments, at least insulating region 360, 660 or 662 (FIGS. 6A-6D) or a layer of the set of insulating layers 370 or 670 (FIGS. 3A-3D & 6A-6D) has a height or thickness (not labelled) in the third direction Z that is equal to a height or thickness (not labelled) in the third direction Z of one or more contacts in the set of contacts 310 or 610 (FIGS. 6A-6D) in the MD1 metallization layer.

Other configurations, arrangements or quantities for insulating region 360 or the set of insulating layers 370 are within the scope of the present disclosure.

The set of conductive structures 330 overlap at least the set of contacts 310 or 320. The set of conductive structures 330 are over the set of active regions 302a. In some embodiments, the set of conductive structures 330 are configured to provide an electrical connection from at least an active region of the set of active regions 302 or a gate of the set of gates 304 to at least another active region of the set of active regions 302 or gate of the set of gates 304. In some embodiments, the set of conductive structures 330 is located on the fourth level.

Conductive structure 330a overlaps contacts 310b and 310c, and contact portion 320b. Conductive structure 330a is over active regions 302a3 and 302a4. In some embodiments, conductive structure 330a extends between gates 304c and 304e.

Conductive structure 330b overlaps contacts 310f, 310g, 310h, 310i and 310j, and contact portion 320a. Conductive structure 330b is over sub-set of active regions 302b. Conductive structure 330b is over active regions 302b2, 302b3, 302b4, 302b5 and 302b6. In some embodiments, conductive structure 330b extends between gates 304b and 304g.

Other configurations, arrangements on other levels or quantities of structures in the set of conductive structures 330 are within the scope of the present disclosure.

The set of power rails 332 extend in the first direction X. In some embodiments, the first set of power rails 332 are located on the fourth level. In some embodiments, power rail 332a or 632a is configured to provide the second supply voltage of the reference voltage supply VSS to integrated circuit 300 or 600. In some embodiments, power rail 332b or 632b is configured to provide the first supply voltage of the voltage supply VDD to integrated circuit 300 or 600. In some embodiments, power rail 332a or 632a is configured to provide the first supply voltage of the voltage supply VDD, and power rail 332b or 632b is configured to provide the second supply voltage of the reference voltage supply VSS. Other configurations, arrangements on other levels or quantities of power rails in the set of power rails 332 or 632 are within the scope of the present disclosure.

In some embodiments, via 340a, 340b, 340d, 340e, 340f, 340g, 340h or 340i of the set of vias 340 are positioned at the VDT level. In some embodiments, via 340c of the set of vias 340 are positioned at the VD level. In some embodiments, a height in a third direction Z of at least via 340a, 340b, 340d, 340e, 340f, 340g, 340h or 340i of the set of vias 340 is the same as a height in the third direction Z of at least another via of via 340a, 340b, 340d, 340e, 340f, 340g, 340h or 340i of the set of vias 340. In some embodiments, a height of at least via 340a, 340b, 340d, 340e, 340f, 340g, 340h or 340i of the set of vias 340 is different from a height of via 340c of the set of vias 340. In some embodiments, a height or thickness (not labelled) in the third direction Z of one or more vias in the set of vias 340 or 640 (FIGS. 6A-6D) in the VDT level is equal to a sum of a height or thickness (not labelled) in the third direction Z of at least one contact portion in the set of contacts 320 or 620 (FIGS. 6A-6D) and a height or thickness (not labelled) in the third direction Z of one or more vias in the set of vias 340 or 640 (FIGS. 6A-6D) in the VD level.

In some embodiments, the active region 302b1 (e.g., source of PMOS transistor P4 of FIG. 1) and the active region 302b3 (e.g., the source of PMOS transistor P2 of FIG. 1) are electrically coupled to the voltage supply VDD. For example, in some embodiments, active region 302b1, 302b3 is electrically coupled to corresponding contact 310e, 310g of the set of contacts 310, and corresponding contact 310e, 310g is electrically coupled to power rail 332b of the set of power rails 320 by corresponding via 340e, 340g of the set of vias 340. In some embodiments, power rail 332b is coupled to voltage supply VDD.

In some embodiments, the active region 302a1 (e.g., the source of NMOS transistor N4 of FIG. 1) and the active region 302a6 (e.g., the source of NMOS transistor N2 of FIG. 1) are electrically coupled to the reference voltage supply VSS. For example, in some embodiments, active region 302a1, 302a6 is electrically coupled to corresponding contact 310a, 310d of the set of contacts 310, and corresponding contact 310a, 310d is electrically coupled to power rail 332a of the set of power rails 320 by corresponding via 340a, 340d of the set of vias 340. In some embodiments, power rail 332a is coupled to the reference voltage supply VSS.

In some embodiments, conductive structure 330b of the set of conductive structures 330 is configured to provide an electrical connection between at least a portion (e.g., drain) of a first transistor (e.g., PMOS transistors P2 and P4), a portion (e.g., source) of a second transistor (e.g., PMOS transistor P1) and a portion (e.g., source) of a third transistor (e.g., PMOS transistor P3). For example, in some embodiments, the active region 302b2 corresponds to the drain of PMOS transistors P2 and P4, the active region 302b4 corresponds to the drain of PMOS transistor P1, the active region 302b6 corresponds to the drain of PMOS transistor P3, and are electrically coupled together by at least conductive structure 330b. In some embodiments, active region 302b2, 302b4, 302b6 is electrically coupled to corresponding contact 310f, 310h, 310j of the set of contacts 310, and corresponding contact 310f, 310h, 310j of the set of contacts 310 is electrically coupled to conductive structure 330b by corresponding vias 340f, 340h, 340i of the set of vias 340.

In some embodiments, at least contact portions 320a and 320b of the set of contacts 320 are configured to provide an electrical connection between each of a portion (e.g., drain) of at least transistor (e.g., PMOS transistors P1 and P3), a portion (e.g., drain) of another transistor (e.g., NMOS transistor N1), and a portion (e.g., drain) of yet another transistor (e.g., NMOS transistor N3). For example, in some embodiments, the active region 302b5 corresponds to the drain of PMOS transistors P1 and P3, the active region 302a4 corresponds to the drain of NMOS transistor N1, and the active region 302a3 corresponds to the drain of NMOS transistor N3, and are electrically coupled together by at least contact portions 320a and 320b of the set of contacts 320.

In some embodiments, active region 302b5 is electrically coupled to contact 310i of the set of contacts 310, contact 310i of the set of contacts 310 is electrically coupled to contact portions 320a and 320b of the set of contacts 320, contact portions 320a and 320b of the set of contacts 320 are electrically coupled to contact 310c of the set of contacts 310, and contact 310c of the set of contacts 310 is electrically coupled to active region 302a4. In some embodiments, contact portions 320a and 320b of the set of contacts 320 are further electrically coupled to conductive structure 330a of the set of conductive structures 330 by via 340c of the set of vias 340, conductive structure 330a is electrically coupled to contact 310b by via 340b of the set of vias 340, and contact 310b of the set of contacts 310 is electrically coupled to active region 302a3.

In some embodiments, contact portions 320a and 320b of the set of contacts 320 are electrically insulated (e.g., not electrically coupled) with active region 302a5 by insulating region 360, and therefore active regions 302b5, 302a3 and 302a4 are electrically insulated (e.g., not electrically coupled) with active regions 302a5 by insulating region 360.

In some embodiments, by at least providing an electrical connection between active regions 302b5, 302a3 and 302a4 of the set of active regions 302 using contact portions 320a and 320b of the set of contacts 320 in the MD2 layer, or electrically insulating active region 302a5 from active regions 302b5, 302a3 and 302a4 using insulating region 360, other metallization levels (e.g., M0, M1, etc.) can be utilized for additional routing resources resulting in integrated circuit 300 having at least a reduced pitch, a smaller area or a smaller standard cell than other approaches.

Integrated Circuit

Figure 4:
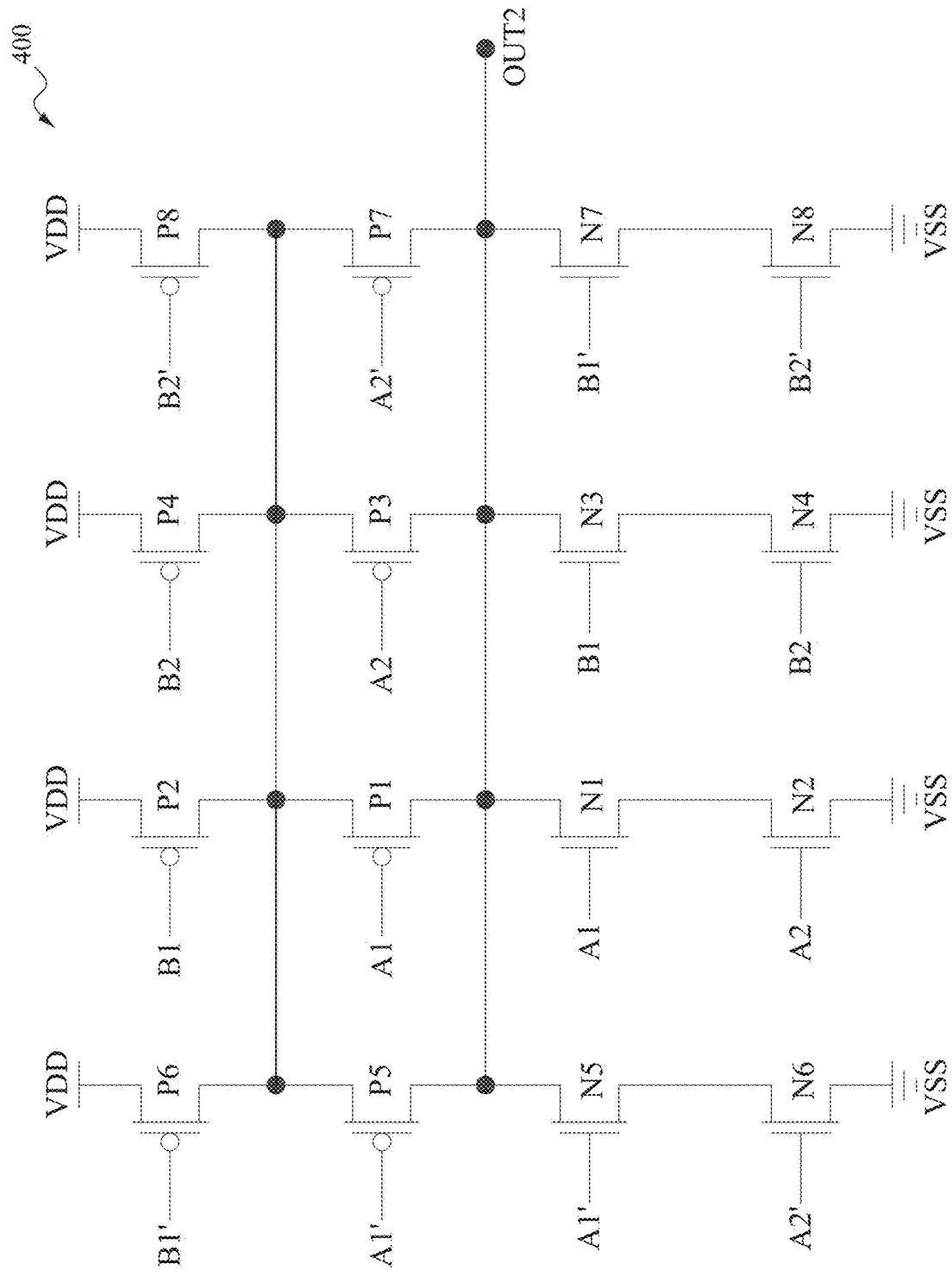
FIG. 4 is a circuit diagram of an integrated circuit, in accordance with some embodiments.

FIG. 4 is a circuit diagram of an integrated circuit 400, in accordance with some embodiments. In some embodiments, integrated circuit 400 is a 2-2 AOI circuit. A 2-2 AOI circuit is used for illustration, other types of circuits including other types of AOI circuits are within the scope of the present disclosure.

Integrated circuit 400 is a variation of integrated circuit 100. In comparison with integrated circuit 100 of FIG. 1, integrated circuit 400 further includes PMOS transistors P5, P6, P7 and P8 and NMOS transistors N5, N6, N7 and N8.

A gate terminal of PMOS transistor P5 is configured as an input node (not labelled) configured to receive an input signal A1'. A gate terminal of NMOS transistor N5 is configured as an input node (not labelled) configured to receive input signal A1'. In some embodiments, input signal A1 is equal to input signal A1'. In some embodiments, at least the gate terminal of PMOS transistor P1, the gate terminal of PMOS transistor P5, the gate terminal of NMOS transistor N1 or the gate terminal of NMOS transistor N5 is coupled to at least another of the gate terminal of PMOS transistor P1, the gate terminal of PMOS transistor P5, the gate terminal of NMOS transistor N1 or the gate terminal of NMOS transistor N5.

A gate terminal of PMOS transistor P6 is configured as an input node (not labelled) configured to receive an input signal B1'. A gate terminal of NMOS transistor N7 is configured as an input node (not labelled) configured to receive input signal B1'. In some embodiments, input signal B1 is equal to input signal B1'. In some embodiments, at least the gate terminal of PMOS transistor P2, the gate terminal of PMOS transistor P6, the gate terminal of NMOS transistor N3 or the gate terminal of NMOS transistor N7 is coupled to at least another of the gate terminal of PMOS transistor P2, the gate terminal of PMOS transistor P6, the gate terminal of NMOS transistor N3 or the gate terminal of NMOS transistor N7.

A gate terminal of PMOS transistor P7 is configured as an input node (not labelled) configured to receive an input signal A2'. A gate terminal of NMOS transistor N6 is configured as an input node (not labelled) configured to receive input signal A2'. In some embodiments, input signal A2 is equal to input signal A2'. In some embodiments, at least the gate terminal of PMOS transistor P3, the gate terminal of PMOS transistor P7, the gate terminal of NMOS transistor N2 or the gate terminal of NMOS transistor N6 is coupled to at least another of the gate terminal of PMOS transistor P3, the gate terminal of PMOS transistor P7, the gate terminal of NMOS transistor N2 or the gate terminal of NMOS transistor N6.

A gate terminal of PMOS transistor P8 is configured as an input node (not labelled) configured to receive an input signal B2'. A gate terminal of NMOS transistor N8 is configured as an input node (not labelled) configured to receive input signal B2'. In some embodiments, input signal B2 is equal to input signal B2'. In some embodiments, at least the gate terminal of PMOS transistor P4, the gate terminal of PMOS transistor P8, the gate terminal of NMOS transistor N4 or the gate terminal of NMOS transistor N8 is coupled to at least another of the gate terminal of PMOS transistor P4, the gate terminal of PMOS transistor P8, the gate terminal of NMOS transistor N4 or the gate terminal of NMOS transistor N8. In some embodiments, at least input signal A1, A1', A2, A2', B1, B1', B2 or B2' is a logically low signal or a logically high signal.

A source terminal of PMOS transistor P2, a source terminal of PMOS transistor P4, a source terminal of PMOS transistor P6 and a source terminal of PMOS transistor P8 are coupled to the voltage supply VDD. In some embodiments, the source terminal of PMOS transistor P2, the source terminal of PMOS transistor P4, the source terminal of PMOS transistor P6 and the source terminal of PMOS transistor P8 are coupled together.

A drain terminal of PMOS transistor P2, a source terminal of PMOS transistor P1, a drain terminal of PMOS transistor P4, a source terminal of PMOS transistor P3, a drain terminal of PMOS transistor P6, a source terminal of PMOS transistor P5, a drain terminal of PMOS transistor P8, a source terminal of PMOS transistor P7 are coupled to each other.

A drain terminal of PMOS transistor P1, a drain terminal of PMOS transistor P3, a drain terminal of NMOS transistor N1, a drain terminal of NMOS transistor N3, a drain terminal of PMOS transistor P5, a drain terminal of PMOS transistor P7, a drain terminal of NMOS transistor N5 and a drain terminal of NMOS transistor N7 are coupled to each other, and are configured as an output node OUT2.

A source terminal of NMOS transistor N1 and a drain terminal of NMOS transistor N2 are coupled to each other. A source terminal of NMOS transistor N3 and a drain terminal of NMOS transistor N4 are coupled to each other. A source terminal of NMOS transistor N5 and a drain terminal of NMOS transistor N6 are coupled to each other. A source terminal of NMOS transistor N7 and a drain terminal of NMOS transistor N8 are coupled to each other.

A source terminal of NMOS transistor N2, a source terminal of NMOS transistor N4, a source terminal of NMOS transistor N6, a source terminal of NMOS transistor N8 are each coupled to a reference voltage supply VSS. In some embodiments, the source terminal of NMOS transistor N2, the source terminal of NMOS transistor N4, the source terminal of NMOS transistor N6 and the source terminal of NMOS transistor N8 are coupled together.

Other circuits, other types of transistors, and/or quantities of transistors are within the scope of various embodiments. For example, in some embodiments, integrated circuit 400 includes other types of AOI logic circuits, such as a 2-1 AOI logic circuit. Other values of at least input signal A1, A1', A2, A2', B1, B1', B2 or B2' are within the scope of various embodiments.

Layout Design of an Integrated Circuit

Figure 5:
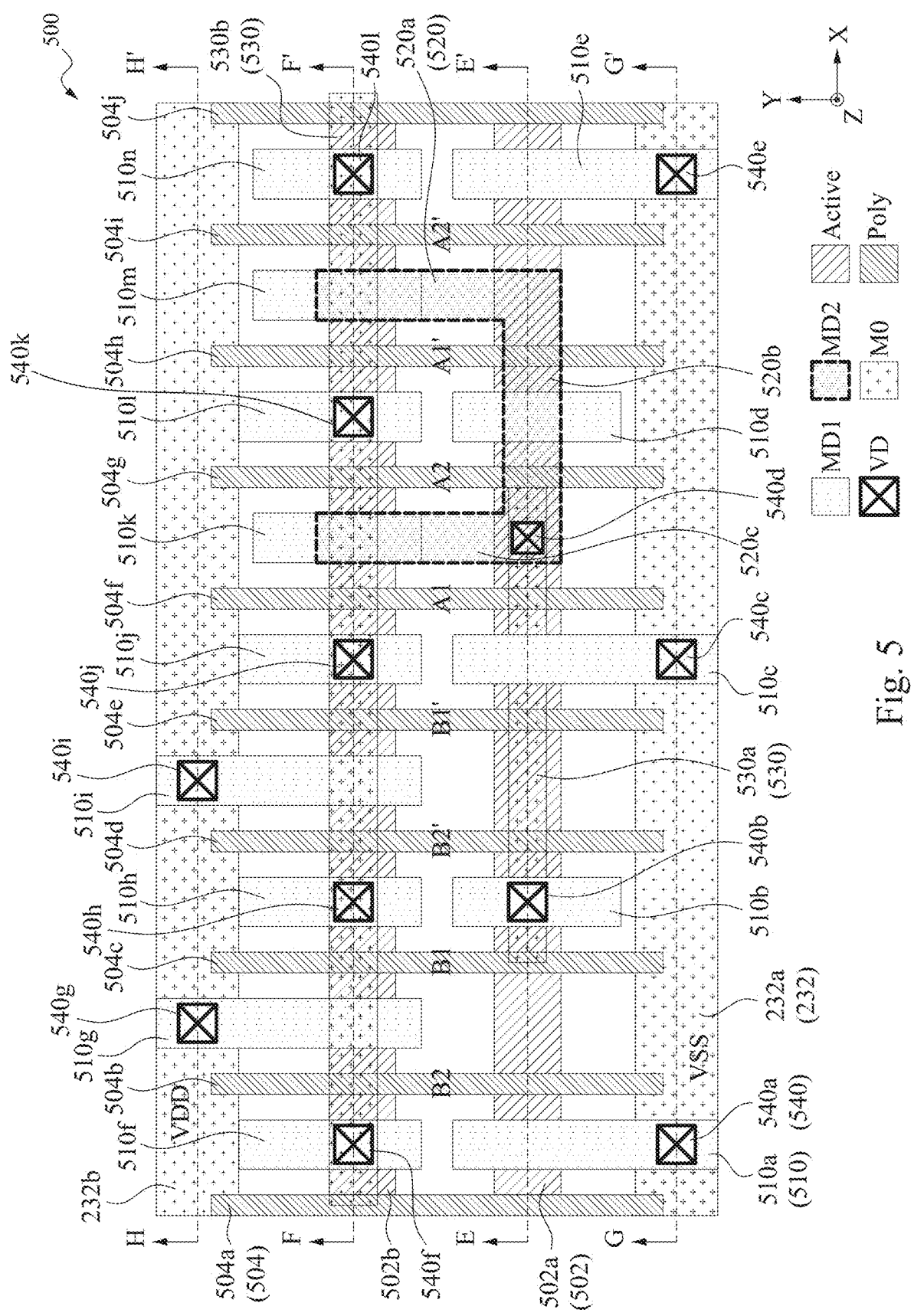
FIG. 5 is a diagram of a layout design of an integrated circuit, in accordance with some embodiments.

FIG. 5 is a diagram of a layout design 500 of an integrated circuit, in accordance with some embodiments.

Layout design 500 is a variation of layout design 200 (FIG. 2). For example, layout design 500 illustrates an example where a set of metal over diffusion layout patterns 520 has a U-shape.

Layout design 500 is usable to manufacture an integrated circuit similar to integrated circuit 400 of FIG. 4 or integrated circuit 600 of FIGS. 6A-6D.

Layout design 500 includes a set of active region layout patterns 502, the set of power rail layout patterns 232, a set of gate layout patterns 504, a set of metal over diffusion layout patterns 510, a set of metal over diffusion layout patterns 520, a set of conductive feature layout patterns 530, and a set of via layout patterns 540.

In comparison with layout design 200 of FIG. 2, the set of active region layout patterns 502 of layout design 500 replace the set of active region layout patterns 202. The set of active region layout patterns 502 are similar to the set of active region layout patterns 202, and similar detailed description is therefore omitted.

Set of active region layout patterns 502 includes at least active region layout pattern 502a or 502b. Active region layout patterns 502a and 502b of the set of active region layout patterns 502 are similar to corresponding active region layout patterns 202a and 202b of the set of active region layout patterns 202, and similar detailed description is therefore omitted.

The set of active region layout patterns 502 is usable to manufacture a corresponding set of active regions 602 (FIGS. 6A-6B) of integrated circuit 600. In some embodiments, active region layout pattern 502a, 502b of the set of active region layout patterns 202 is usable to manufacture corresponding active regions 602a, 602b of the set of active regions 602 (FIGS. 6A-6B) of integrated circuit 600.

In some embodiments, active region layout pattern 502a of the set of active region layout patterns 502 is usable to manufacture source and drain regions of NMOS transistors N1, N2, N3, N4, N5, N6, N7 and N8, and active region layout pattern 502b of the set of active region layout patterns 502 are usable to manufacture source and drain regions of PMOS transistors P1, P2, P3, P4, P5, P6, P7 and P8 of integrated circuit 400 (FIG. 4).

Other configurations or quantities of patterns in the set of active region layout patterns 502 are within the scope of the present disclosure.

In comparison with layout design 200 of FIG. 2, the set of gate layout patterns 504 of layout design 500 replaces the set of gate layout patterns 204. The set of gate layout patterns 504 of layout design 500 and integrated circuit 600 have a CPP of 9. The set of gate layout patterns 504 are similar to the set of gate layout patterns 204, and similar detailed description is therefore omitted.

Set of gate layout patterns 504 includes at least gate layout pattern 504a, 504b, 504c, 504d, 504e, 504f, 504g, 504h, 504i or 504j. At least one of gate layout pattern 504a, 504b, 504c, 504d, 504e, 504f, 504g, 504h, 504i or 504j of the set of gate layout patterns 504 is similar to at least one of gate layout pattern 204a, 204b, 204c, 204d, 204e, 204f or 204g of the set of gate layout patterns 204, and similar detailed description is therefore omitted.

The set of gate layout patterns 504 is usable to manufacture a corresponding set of gates 604 (FIGS. 6A-6D) of integrated circuit 600. In some embodiments, gate layout patterns 504a, 504b, 504c, 504d, 504e, 504f, 504g, 504h, 504i, 504j of the set of gate layout patterns 504 are usable to manufacture corresponding gates 604a, 604b, 604c, 604d, 604e, 604f, 604g, 604h, 604i, 604j of the set of gates 604 (FIGS. 6A-6D) of integrated circuit 600. In some embodiments, at least gate layout pattern 504a or 504j is a dummy gate layout pattern. In some embodiments, at least gate 604a or 604j is a dummy gate.

Gate layout pattern 504b is usable to manufacture the gate terminal of PMOS transistor P4 and the gate terminal of NMOS transistor N4 of FIG. 4. Gate layout pattern 504c is usable to manufacture the gate terminal of PMOS transistor P2 and the gate terminal of NMOS transistor N3 of FIG. 4. Gate layout pattern 504d is usable to manufacture the gate terminal of PMOS transistor P6 and the gate terminal of NMOS transistor N7 of FIG. 4. Gate layout pattern 504e is usable to manufacture the gate terminal of PMOS transistor P8 and the gate terminal of NMOS transistor N8 of FIG. 4.

Gate layout pattern 504*f* is usable to manufacture the gate terminal of PMOS transistor P3 and the gate terminal of NMOS transistor N2 of FIG. 4. Gate layout pattern 504*g* is usable to manufacture the gate terminal of PMOS transistor P1 and the gate terminal of NMOS transistor N1 of FIG. 4. Gate layout pattern 504*h* is usable to manufacture the gate terminal of PMOS transistor P5 and the gate terminal of NMOS transistor N5 of FIG. 4. Gate layout pattern 504*i* is usable to manufacture the gate terminal of PMOS transistor P7 and the gate terminal of NMOS transistor N6 of FIG. 4.

Other configurations, arrangements on other levels or quantities of patterns in the set of gate layout patterns 504 are within the scope of the present disclosure.

In comparison with layout design 200 of FIG. 2, the set of metal over diffusion layout patterns 510 replaces the set of metal over diffusion layout patterns 210. The set of metal over diffusion layout patterns 510 are similar to the set of metal over diffusion layout patterns 210, and similar detailed description is therefore omitted.

Set of metal over diffusion layout patterns 510 includes at least metal over diffusion layout pattern 510*a*, 510*b*, 510*c*, 510*d*, 510*e*, 510*f*, 510*g*, 510*h*, 510*i*, 510*j*, 510*k*, 510*l*, 510*m* or 510*n*. At least one of metal over diffusion layout pattern 510*a*, 510*b*, 510*c*, 510*d*, 510*e*, 510*f*, 510*g*, 510*h*, 510*i*, 510*j*, 510*k*, 510*l*, 510*m* or 510*n* of the set of metal over diffusion layout patterns 510 is similar to at least one of metal over diffusion layout pattern 210*a*, 210*b*, 210*c*, 210*d*, 210*e*, 210*f*, 210*g*, 210*h*, 210*i* or 210*j* of the set of metal over diffusion layout patterns 210, and similar detailed description is therefore omitted.

The set of metal over diffusion layout patterns 510 is usable to manufacture a corresponding set of contacts 610 (FIGS. 6A-6D) of integrated circuit 600. In some embodiments, metal over diffusion layout patterns 510*a*, 510*b*, 510*c*, 510*d*, 510*e*, 510*f*, 510*g*, 510*h*, 510*i*, 510*j*, 510*k*, 510*l*, 510*m*, 510*n* of the set of metal over diffusion layout patterns 510 are usable to manufacture corresponding contacts 610*a*, 610*b*, 610*c*, 610*d*, 610*e*, 610*f*, 610*g*, 610*h*, 610*i*, 610*j*, 610*k*, 610*l*, 610*m*, 610*n* of the set of contacts 610 (FIGS. 6A-6D) of integrated circuit 600.

Other configurations, arrangements on other levels or quantities of patterns in the set of metal over diffusion layout patterns 510 are within the scope of the present disclosure.

In comparison with layout design 200 of FIG. 2, the set of metal over diffusion layout patterns 520 replaces the set of metal over diffusion layout patterns 220. The set of metal over diffusion layout patterns 520 are similar to the set of metal over diffusion layout patterns 220, and similar detailed description is therefore omitted.

In comparison with layout design 200 of FIG. 2, the set of metal over diffusion layout patterns 520 has a U-shape. In some embodiments, the set of metal over diffusion layout patterns 520 has one or more of an L-shape similar to a set of metal over diffusion layout patterns 220 of FIG. 2, a W-shape similar to a set of metal over diffusion layout patterns 700A of FIG. 7A, a T-shape similar to a set of metal over diffusion layout patterns 700B of FIG. 7B, an O-shape (not shown), or the like. Other shapes in the set of metal over diffusion layout patterns 520 are within the scope of the present disclosure.

Set of metal over diffusion layout patterns 520 includes at least metal over diffusion layout pattern 520*a*, 520*b* or 520*c*.

In comparison with layout design 200 of FIG. 2, metal over diffusion layout patterns 520*a* and 520*b* replace corresponding metal over diffusion layout patterns 220*a* and 220*b* of FIG. 2, and similar detailed description is therefore omitted.

Metal over diffusion layout pattern 520*a* and 520*c* extend in the second direction Y. Metal over diffusion layout pattern 520*b* extends in the first direction X. Metal over diffusion layout pattern 520*a* is separated from metal over diffusion layout pattern 520*c* in the first direction X. In some embodiments, metal over diffusion layout pattern 520*b* extends from metal over diffusion layout pattern 520*a* to metal over diffusion layout pattern 520*c*. In some embodiments, metal over diffusion layout patterns 520*a*, 520*b* and 520*c* are portions of a same continuous layout pattern (e.g., set of metal over diffusion layout patterns 520).

In some embodiments, the set of metal over diffusion layout patterns 520 includes two or more separate or discontinuous layout patterns that are separated from each other in at least the first direction X or the second direction Y.

At least one of the layout patterns of the set of metal over diffusion layout patterns 520 overlaps at least one of the set of active region layout patterns 502 or at least one of the set of metal over diffusion layout patterns 510.

Metal over diffusion layout pattern 520*a* overlaps metal over diffusion layout pattern 510*m* and active region layout patterns 502*a* and 502*b*. Metal over diffusion layout pattern 520*b* overlaps metal over diffusion layout pattern 510*d* and is over active region layout pattern 502*a*. Metal over diffusion layout pattern 520*c* overlaps metal over diffusion layout pattern 510*k* and active region layout patterns 502*a* and 502*b*.

The set of metal over diffusion layout patterns 520 is usable to manufacture a corresponding set of contacts 620 (FIGS. 6A-6D) of integrated circuit 600. In some embodiments, metal over diffusion layout patterns 520*a*, 520*b*, 520*c* of the set of metal over diffusion layout patterns 520 are usable to manufacture corresponding contact portions 620*a*, 620*b*, 620*c* of the set of contacts 620 (FIGS. 6A-6D) of integrated circuit 600.

In some embodiments, at least metal over diffusion layout pattern 510*a* is usable to manufacture the source terminal of NMOS transistor N4 of FIG. 4. In some embodiments, at least metal over diffusion layout pattern 510*b* is usable to manufacture the drain terminal of NMOS transistor N3 of FIG. 4 and the drain terminal of NMOS transistor N7 of FIG. 4. In some embodiments, at least metal over diffusion layout pattern 510*c* is usable to manufacture the source terminal of NMOS transistor N2 of FIG. 4 and the source terminal of NMOS transistor N8 of FIG. 4. In some embodiments, at least metal over diffusion layout pattern 510*d* is usable to manufacture the drain terminal of NMOS transistor N1 of FIG. 4 and the drain terminal of NMOS transistor N5 of FIG. 4. In some embodiments, at least metal over diffusion layout pattern 510*e* is usable to manufacture the source terminal of NMOS transistor N6 of FIG. 4.

In some embodiments, at least metal over diffusion layout pattern 510*f* is usable to manufacture the drain terminal of PMOS transistor P4 of FIG. 4. In some embodiments, at least metal over diffusion layout pattern 510*g* is usable to manufacture the source terminal of PMOS transistor P4 of FIG. 4 and the source terminal of PMOS transistor P2 of FIG. 4. In some embodiments, at least metal over diffusion layout pattern 510*h* is usable to manufacture the drain terminal of PMOS transistor P2 of FIG. 4 and the drain terminal of PMOS transistor P6 of FIG. 4.

In some embodiments, at least metal over diffusion layout pattern 510*i* is usable to manufacture the source terminal of PMOS transistor P6 of FIG. 4 and the source terminal of PMOS transistor P8 of FIG. 4. In some embodiments, at least metal over diffusion layout pattern 510*j* is usable to manufacture the drain terminal of PMOS transistor P8 of FIG. 4 and the source terminal of PMOS transistor P3 of FIG. 4. In some embodiments, at least metal over diffusion layout pattern 5101 is usable to manufacture the source terminal of PMOS transistor P1 of FIG. 4 and the source terminal of PMOS transistor P5 of FIG. 4. In some embodiments, at least metal over diffusion layout pattern 510*n* is usable to manufacture the source terminal of PMOS transistor P7 of FIG. 4.

In some embodiments, at least metal over diffusion layout pattern 510*k* or a portion of metal over diffusion layout pattern 520*c* is usable to manufacture the drain terminal of PMOS transistor P3 of FIG. 4 and the drain terminal of PMOS transistor P1 of FIG. 4. In some embodiments, at least metal over diffusion layout pattern 510*m* or a portion of metal over diffusion layout pattern 520*a* is usable to manufacture the drain terminal of PMOS transistor P5 of FIG. 4 and the drain terminal of PMOS transistor P7 of FIG. 4.

In some embodiments, at least metal over diffusion layout pattern 220*a*, 220*b* or 220*c* is usable to manufacture portions of one or more drain or source terminals of at least NMOS transistor N1, N2, N3, N4, N5, N6, N7 or N8 or PMOS transistor P1, P2, P3, P4, P5, P6, P7 or P8 of FIG. 4.

Other configurations, arrangements on other levels or quantities of patterns in the set of metal over diffusion layout patterns 520 are within the scope of the present disclosure.

In comparison with layout design 200 of FIG. 2, the set of conductive feature layout patterns 530 replaces the set of conductive feature layout patterns 230. The set of conductive feature layout patterns 530 are similar to the set of conductive feature layout patterns 230, and similar detailed description is therefore omitted.

Set of conductive feature layout patterns 530 includes at least conductive feature layout patterns 530*a* or 530*b*. Conductive feature layout pattern 530*a*, 530*b* replaces corresponding conductive feature layout pattern 230*a*, 230*b* of FIG. 2, and similar detailed description is therefore omitted.

In some embodiments, conductive feature layout pattern 530*a* extends between gate layout pattern 504*c* and 504*g*. In some embodiments, conductive feature layout pattern 530*b* extends from gate layout pattern 504*a* to gate layout pattern 504*j*.

In some embodiments, conductive feature layout pattern 530*a* overlaps metal over diffusion layout patterns 510*b*, 510*c*, 520*b* and 520*c*. In some embodiments, conductive feature layout pattern 530*b* overlaps metal over diffusion layout patterns 510*f*, 510*g*, 510*h*, 510*i*, 510*j*, 510*k*, 510*l*, 510*m*, 510*n*, 520*a* and 520*c*.

The set of conductive feature layout patterns 530 is usable to manufacture a corresponding set of conductive features 630 (FIGS. 6A-6D) of integrated circuit 600. In some embodiments, conductive feature layout patterns 530*a* and 530*b* of the set of conductive feature layout patterns 530 are usable to manufacture corresponding conductive structures 630*a* and 630*b* of the set of conductive structures 630 (FIGS. 6A-6D) of integrated circuit 600.

Other configurations, arrangements on other levels or quantities of patterns in the set of conductive feature layout patterns 530 are within the scope of the present disclosure.

In comparison with layout design 200 of FIG. 2, the set of via layout patterns 540 replaces the set of via layout patterns 240. The set of via layout patterns 540 are similar to the set of via layout patterns 240, and similar detailed description is therefore omitted.

Set of via layout patterns 540 includes at least via layout pattern 540*a*, 540*b*, 540*c*, 540*d*, 540*e*, 540*f*, 540*g*, 540*h*, 540*i*, 540*j*, 540*k* or 540*l*. At least one of via layout pattern 540*a*, 540*b*, 540*c*, 540*d*, 540*e*, 540*f*, 540*g*, 540*h*, 540*i*, 540*j*, 540*k* or 540*l* of the set of via layout patterns 540 is similar to at least one of via layout pattern 240*a*, 240*b*, 240*c*, 240*d*, 240*e*, 240*f*, 240*g*, 240*h* or 240*i* of the set of via layout patterns, and similar detailed description is therefore omitted.

The set of via layout patterns 540 is usable to manufacture a corresponding set of vias 640 (FIGS. 6A-6D) of integrated circuit 600. In some embodiments, via layout patterns 540*a*, 540*b*, 540*c*, 540*d*, 540*e*, 540*f*, 540*g*, 540*h*, 540*i*, 540*j*, 540*k*, 540*l* of the set of via layout patterns 540 are usable to manufacture corresponding vias 640*a*, 640*b*, 640*c*, 640*d*, 640*e*, 640*f*, 640*g*, 640*h*, 640*i*, 640*j*, 640*k*, 640*l* of the set of vias 640 (FIGS. 6A-6D) of integrated circuit 600. In some embodiments, the set of via layout patterns 560 includes other members (not shown for ease of illustration).

Via layout patterns 540*a*, 540*c* and 540*e* are between power rail layout pattern 232*a* of FIG. 5 and corresponding metal over diffusion layout patterns 510*a*, 510*c* and 510*e*. Via layout patterns 540*g* and 540*i* are between power rail layout pattern 232*b* of FIG. 5 and corresponding metal over diffusion layout patterns 510*g* and 510*i*. Via layout patterns 540*b* and 540*d* are between conductive feature layout pattern 530*a* and corresponding metal over diffusion layout patterns 510*b* and 520*b*. Via layout patterns 540*f*, 540*h*, 540*j*, 540*k* and 540*l* are between conductive feature layout pattern 530*b* and corresponding metal over diffusion layout patterns 510*f*, 510*h*, 510*j*, 5101 and 510*n*.

Other configurations, arrangements on other levels or quantities of patterns in the set of via layout patterns 540 are within the scope of the present disclosure.

In some embodiments, by extending the set of metal over diffusion layout patterns 520 in the first direction X and the second direction Y (e.g., 2 directions) and by positioning the set of metal over diffusion layout patterns 520 to overlap at least the set of metal over diffusion layout patterns 510, the set of gate layout patterns 504 or the set of active regions 502, the set of metal over diffusion layout patterns 520 provide additional routing resources in the second direction Y and located below upper metallization layers (e.g., M0, M1, etc.) in layout design 500. By providing routing resources below upper metallization levels (e.g., M0, M1, etc.), the use of the upper metallization layers (e.g., M0, M1, etc.) can be reduced or the upper metallization layers (e.g., M0, M1, etc.) can be utilized as additional routing resources resulting in layout design 500 having at least a reduced pitch, a smaller area or a smaller standard cell than other approaches.

Integrated Circuit

FIGS. 6A, 6B, 6C and 6D are diagrams of an integrated circuit 600, in accordance with some embodiments.

Figure 6A:
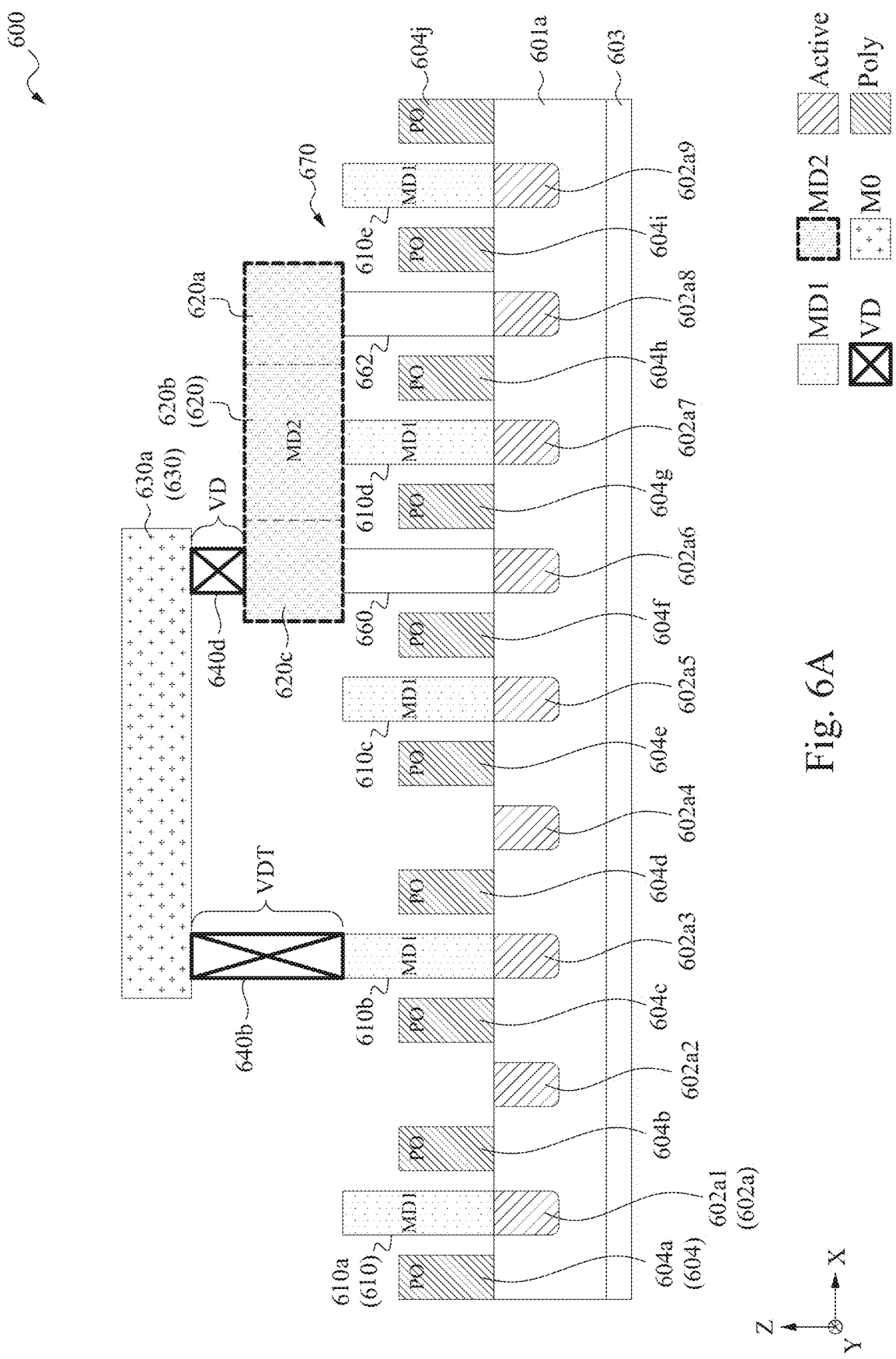
FIGS. 6A, 6B, 6C and 6D are diagrams of an integrated circuit, in accordance with some embodiments.
Figure 6B:
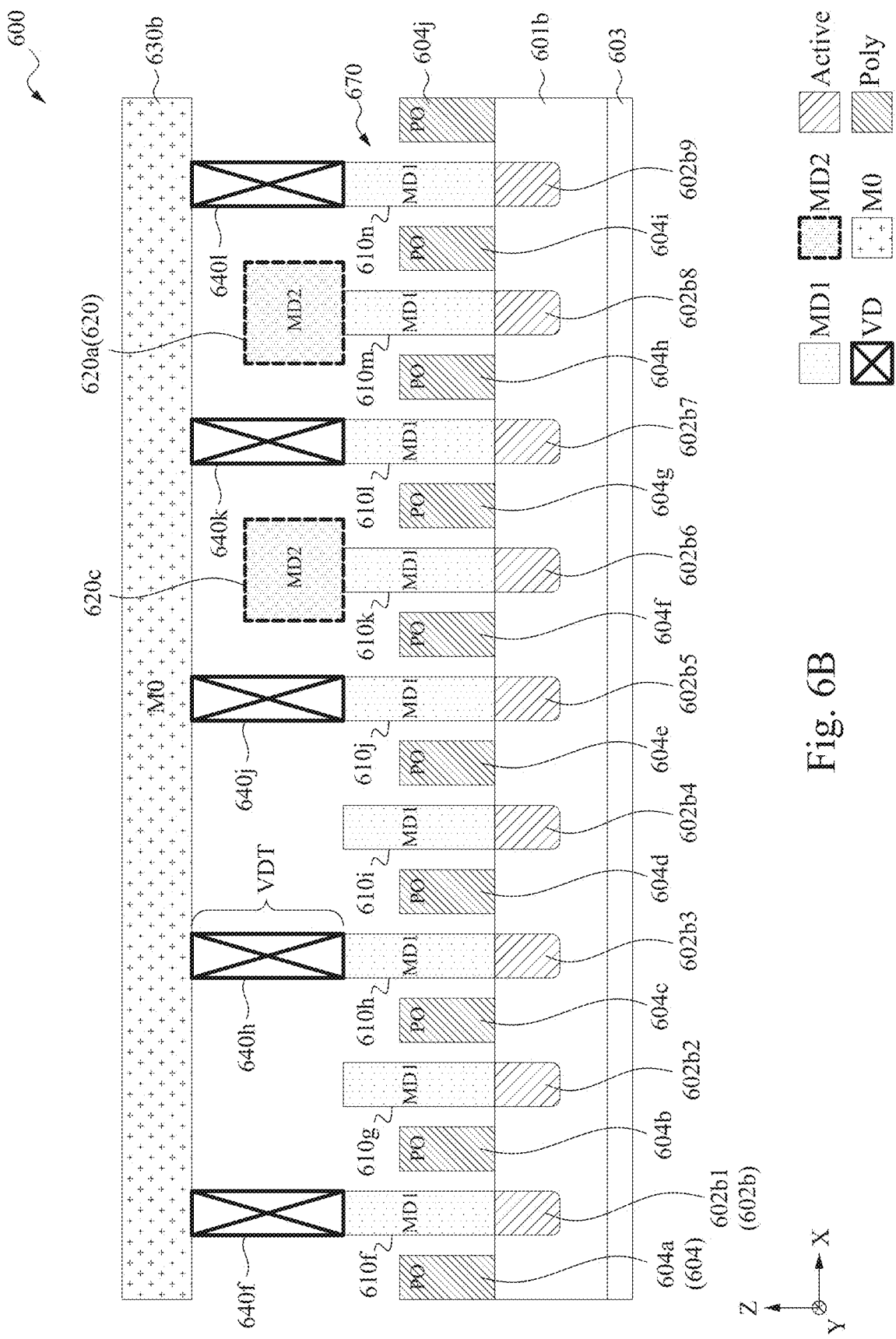
Figure 6C:
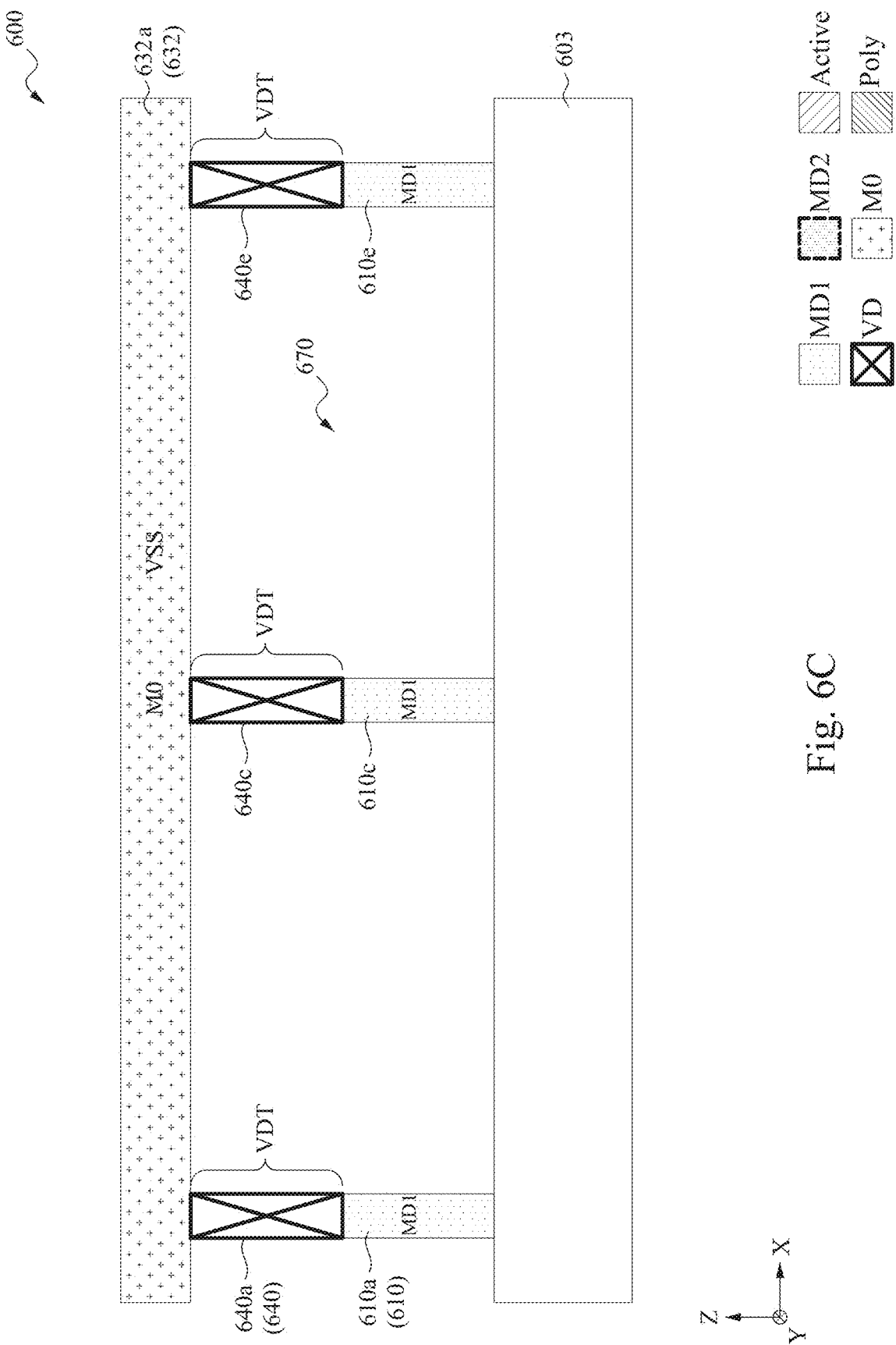
Figure 6D:
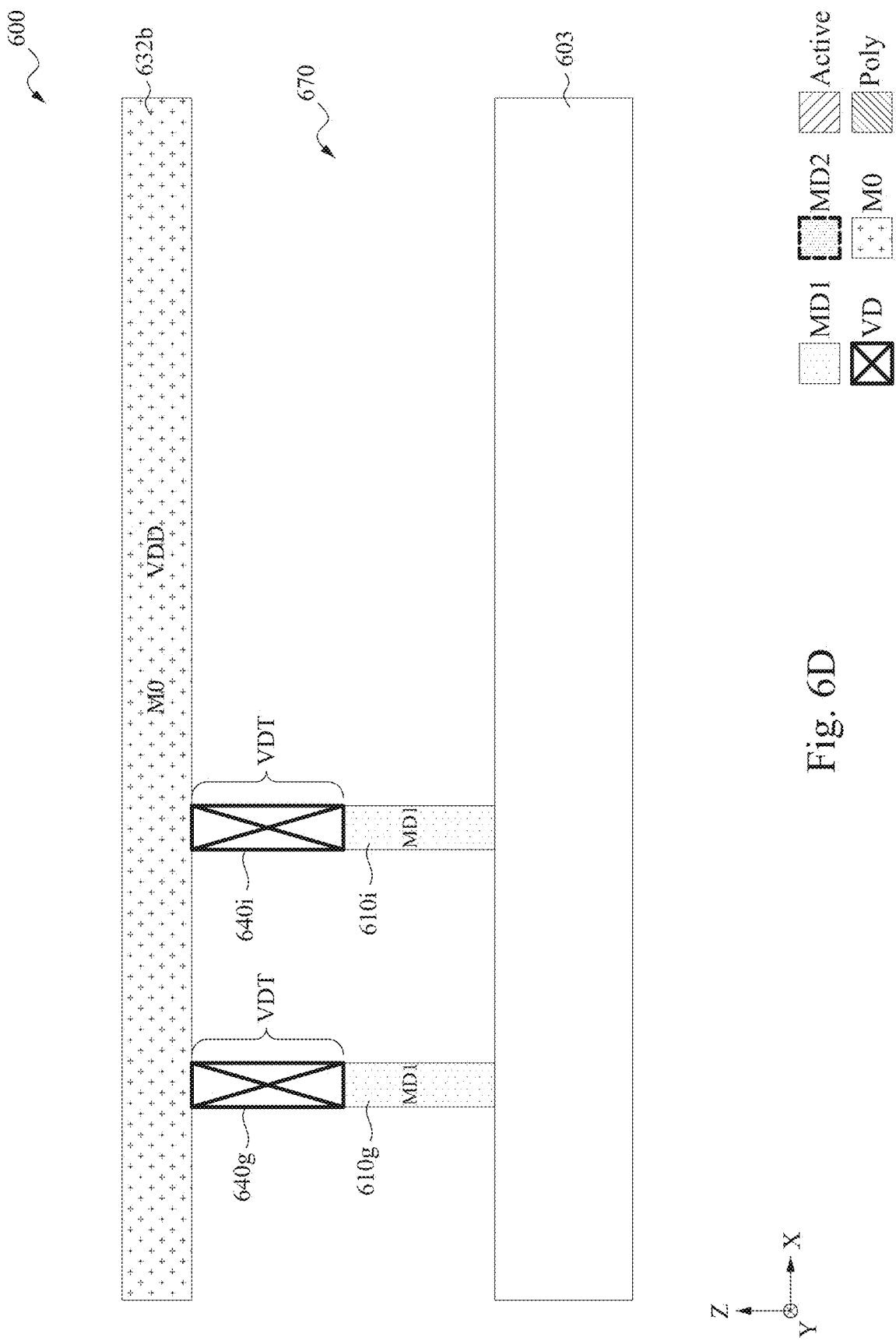

FIG. 6A is a cross-sectional view of an integrated circuit 600 corresponding to layout design 500 as intersected by plane E-E', in accordance with some embodiments. FIG. 6B is a cross-sectional view of an integrated circuit 600 corresponding to layout design 500 as intersected by plane F-F', in accordance with some embodiments. FIG. 6C is a cross-sectional view of an integrated circuit 600 corresponding to layout design 500 as intersected by plane G-G', in accordance with some embodiments. FIG. 6D is a cross-sectional view of an integrated circuit 600 corresponding to layout design 500 as intersected by plane H-H', in accordance with some embodiments.

Integrated circuit 600 is manufactured by layout design 500. Integrated circuit 600 is an embodiment of a portion of integrated circuit 400.

Structural relationships including alignment, lengths and widths, as well as configurations of integrated circuit 600 are similar to the structural relationships and configurations of layout design 500 of FIG. 5, and similar detailed description will not be described in FIGS. 6A-6D for brevity.

Integrated circuit 600 is a variation of integrated circuit 300 (FIGS. 3A-3D), and similar detailed description will not be described for brevity. For example, integrated circuit illustrates an example where a set of contacts 620 has a U-shape.

Integrated circuit 600 includes a well region 601a, a well region 601b, a set of active regions 602, a substrate 603, the set of gates 604, the set of contacts 610, the set of contacts 620, the set of conductive features 630, the set of power rails 632, the set of vias 640 and a set of insulating layers 670.

In comparison with integrated circuit 300 of FIGS. 3A-3D, well region 601a replaces well region 301a, well region 601b replaces well region 301b, set of active regions 602 replaces set of active regions 302, substrate 603 replaces substrate 303, set of gates 604 replaces set of gates 304, set of contacts 610 replaces set of contacts 310, set of contacts 620 replaces set of contacts 320, set of conductive structures 630 replaces set of conductive structures 330, set of power rails 632 replaces set of power rails 332, set of vias 640 replaces the set of vias 340, set of insulating layers 670 replaces set of insulating layers 370, insulating region 660 or 662 replaces insulating region 360.

In some embodiments, well region 601a is similar to well region 301a, well region 601b is similar to well region 301b, set of active regions 602 is similar to set of active regions 302, substrate 603 is similar to substrate 303, set of gates 604 is similar to set of gates 304, set of contacts 610 is similar to set of contacts 310, set of contacts 620 is similar to set of contacts 320, set of conductive structures 630 is similar to set of conductive structures 330, set of power rails 632 is similar to the set of power rails 332, set of vias 640 is similar to the set of vias 340, set of insulating layers 670 is similar to set of insulating layers 370, insulating region 660 or 662 is similar to insulating region 360, and similar detailed description is therefore omitted.

The set of active regions 602 includes a sub-set of active regions 602a and a sub-set of active regions 602b. In some embodiments, sub-set of active regions 602a, 602b is similar to corresponding sub-set of active regions 302a, 302b, and similar detailed description is therefore omitted.

The sub-set of active regions 602a includes at least active region 602a1, 602a2, 602a3, 602a4, 602a5, 602a6, 602a7, 602a8 or 602a9. Each of the active regions 602a1, 602a2, 602a3, 602a4, 602a5, 602a6, 602a7, 602a8 and 602a9 of the sub-set of active regions 602a is separated from an adjacent active region of the sub-set of active regions 602a in the first direction X.

Active regions 602a1, 602a2, 602a3, 602a4, 602a5, 602a6, 602a7, 602a8 and 602a9 of the sub-set of active regions 602a are embedded in the well region 601a of integrated circuit 600.

Active regions 602a1, 602a2, 602a3, 602a4, 602a5, 602a6, 602a7, 602a8 and 602a9 include dopants of the first dopant type. In some embodiments, the first dopant type is an N-type dopant. In some embodiments, the first dopant type is a P-type dopant.

In some embodiments, active regions active regions 602a1, 602a2, 602a3, 602a4, 602a5, 602a6, 602a7, 602a8 and 602a9 include N-type dopants as the first dopant type, and well region 601a is a P-type of well. In some embodiments, active regions Active regions 602a1, 602a2, 602a3, 602a4, 602a5, 602a6, 602a7, 602a8 and 602a9 include P-type dopants as the first dopant type, and well region 601a is an N-type of well.

The sub-set of active regions 602b includes at least active region 602b1, 602b2, 602b3, 602b4, 602b5, 602b6, 602b7, 602b8 or 602b9.

Each of the active regions 602b1, 602b2, 602b3, 602b4, 602b5, 602b6, 602b7, 602b8 and 602b9 of the sub-set of active regions 602b is separated from an adjacent active region of the sub-set of active regions 602b in the first direction X.

Active regions 602b1, 602b2, 602b3, 602b4, 602b5, 602b6, 602b7, 602b8 and 602b9 of the sub-set of active regions 602b are embedded in the well region 601b of integrated circuit 600. Active regions 602b1, 602b2, 602b3, 602b4, 602b5, 602b6, 602b7, 602b8 and 602b9 include dopants of a second dopant type different from the first dopant type. In some embodiments, the second dopant type is a P-type dopant and the first dopant type is an N-type dopant. In some embodiments, the second dopant type is an N-type dopant and the first dopant type is a P-type dopant.

In some embodiments, active regions 602b1, 602b2, 602b3, 602b4, 602b5, 602b6, 602b7, 602b8 and 602b9 include P-type dopants as the second dopant type, and well region 601b is an N-type of well. In some embodiments, active regions 602b1, 602b2, 602b3, 602b4, 602b5, 602b6, 602b7, 602b8 and 602b9 include N-type dopants as the second dopant type, and well region 601b is a P-type of well.

In some embodiments, active region 602a1 corresponds to the source of NMOS transistor N4. In some embodiments, active region 602a2 corresponds to the drain of NMOS transistor N4 and the source of NMOS transistor N3. In some embodiments, active region 602a3 corresponds to the drain of NMOS transistor N3 and the drain of NMOS transistor N7. In some embodiments, active region 602a4 corresponds to the drain of NMOS transistor N8 and the source of NMOS transistor N7. In some embodiments, active region 602a5 corresponds to the source of NMOS transistor N2 and the source of NMOS transistor N8. In some embodiments, active region 602a6 corresponds to the drain of NMOS transistor N2 and the source of NMOS transistor N1. In some embodiments, active region 602a7 corresponds to the drain of NMOS transistor N5 and the drain of NMOS transistor N1. In some embodiments, active region 602a8 corresponds to the source of NMOS transistor N5 and the drain of NMOS transistor N6. In some embodiments, active region 602a9 corresponds to the source of NMOS transistor N6.

In some embodiments, active region 602b1 corresponds to the drain of PMOS transistor P4. In some embodiments, active region 602b2 corresponds to the source of PMOS transistor P2 and the source of PMOS transistor P4. In some embodiments, active region 602b3 corresponds to the drain of PMOS transistor P2 and the drain of PMOS transistor P6. In some embodiments, active region 602b4 corresponds to the source of PMOS transistor P8 and the source of PMOS transistor P6. In some embodiments, active region 602b5 corresponds to the drain of PMOS transistor P8 and the source of PMOS transistor P3. In some embodiments, active region 602b6 corresponds to the drain of PMOS transistor P1 and the drain of PMOS transistor P3. In some embodiments, active region 602b7 corresponds to the source of PMOS transistor P1 and the source of PMOS transistor P5. In some embodiments, active region 602b8 corresponds to the drain of PMOS transistor P7 and the drain of PMOS transistor P5. In some embodiments, active region 602b9 corresponds to the source of PMOS transistor P7.

Other configurations, arrangements on other levels or quantities of active regions in the set of active regions 602 are within the scope of the present disclosure.

Set of gates 604 includes at least gate 604a, 604b, 604c, 604d, 604e, 604f, 604g, 604h, 604i or 604j. At least one of gate 604a, 604b, 604c, 604d, 604e, 604f, 604g, 604h, 604i or 604j of the set of gates 604 is similar to at least one of gate 304a, 304b, 304c, 304d, 304e, 304f or 304g of the set of gates 304, and similar detailed description is therefore omitted. In some embodiments, at least gate 604a or 604j is a dummy gate.

Gate 604b is the gate terminal of PMOS transistor P4 and the gate terminal of NMOS transistor N4 of FIG. 4. Gate 604c is the gate terminal of PMOS transistor P2 and the gate terminal of NMOS transistor N3 of FIG. 4. Gate 604d is the gate terminal of PMOS transistor P6 and the gate terminal of NMOS transistor N7 of FIG. 4. Gate 604e is the gate terminal of PMOS transistor P8 and the gate terminal of NMOS transistor N8 of FIG. 4. Gate 604f is the gate terminal of PMOS transistor P3 and the gate terminal of NMOS transistor N2 of FIG. 4. Gate 604g is the gate terminal of PMOS transistor P1 and the gate terminal of NMOS transistor N1 of FIG. 4. Gate 604h is the gate terminal of PMOS transistor P5 and the gate terminal of NMOS transistor N5 of FIG. 4. Gate 604i is the gate terminal of PMOS transistor P7 and the gate terminal of NMOS transistor N6 of FIG. 4.

The set of contacts 610 includes at least contact 610a, 610b, 610c, 610d, 610e, 610f, 610g, 610h, 610i, 610j, 610k, 610l, 610m or 610n. At least one of contact 610a, 610b, 610c, 610d, 610e, 610f, 610g, 610h, 610i, 610j, 610k, 610l, 610m or 610n of the set of contacts 610 is similar to at least one of contact 310a, 310b, 310c, 310d, 310e, 310f, 310g, 310h, 310i or 310j of the set of contacts 310, and similar detailed description is therefore omitted.

Contacts 610a, 610b, 610c, 610d, 610e, 610f, 610g, 610h, 610i, 610j, 610k, 610l, 610m, and 610n of the set of contacts 610 overlap corresponding active regions 602a1, 602a3, 602a5, 602a7, 602a9, 602b1, 602b2, 602b3, 602b4, 602b5, 602b6, 602b7, 602b8 and 602b9. Contacts 610a, 610b, 610c, 610d, 610e, 610f, 610g, 610h, 610i, 610j, 610k, 610l, 610m and 610n of the set of contacts 610 are electrically coupled to corresponding active regions 602a1, 602a3, 602a5, 602a7, 602a9, 602b1, 602b2, 602b3, 602b4, 602b5, 602b6, 602b7, 602b8 and 602b9. In some embodiments, the set of contacts 610 is located on the second portion of the second level.

Other configurations or arrangements of the set of contacts 610 are within the scope of the present disclosure.

Insulating region 660 or 662 is configured to insulate one or more elements in integrated circuit 600 from each other. In some embodiments, insulating region 660 or 662 is similar to insulating region 360, and similar detailed description is therefore omitted.

Insulating region 660 is over active region 602a6. Insulating region 660 is positioned between contact portions 620a and 620b and active region 602a6 thereby electrically insulating contact portions 620a and 620b from active region 602a6.

Insulating region 662 is over active region 602a8. Insulating region 662 is positioned between contact portions 620b and 620c and active region 602a8 thereby electrically insulating contact portions 620b and 620c from active region 602a8.

In some embodiments, insulating region 660 and 662 are part of a set of insulating layers 670. In some embodiments, at least insulating region 660 or 662 or the set of insulating layers 670 is located on the second portion of the second level.

In some embodiments, the set of insulating layers 670 are configured to electrically insulate at least one member of the set of active regions 602, the set of gates 604, the set of contacts 610, the set of contacts 620, the set of conductive structures 630, the set of power rail 632 or the set of vias 640 from at least another one member of the set of active regions 602, the set of gates 604, the set of contacts 610, the set of contacts 620, the set of conductive structures 630, the set of power rail 632 or the set of vias 640.

In some embodiments, at least insulating region 600 or 662 or the set of insulating layers 670 is over active regions of the set of active regions 602 different from active regions 602a6 or 602a8, and insulating region 660 or 662 or the set of insulating layers 670 electrically isolate the corresponding one or more other active regions from other overlying layers (e.g., contacts in the MD2 layer). For example, in some embodiments, insulating region 660 or 662 or the set of insulating layers 670 can replace one or more contacts of the set of contacts 610.

In some embodiments, at least insulating region 660 or 662 or the set of insulating layers 670 are positioned over one or more gates of the set of gates 604 and at least insulating region 660 or 662 or the set of insulating layers 670 electrically isolate the corresponding one or more gates from other overlying layers (e.g., contacts in the MD2 layer).

Other configurations, arrangements or quantities for at least insulating region 660 or 662 or the set of insulating layers 670 are within the scope of the present disclosure.

The set of contacts 620 extends in the first direction X and the second direction Y. In some embodiments, set of contacts 620 is referred to as a 2D structure since contact portions 620b and 620c (or 620a) extend in at least two different directions (e.g., first direction X and the second direction Y). In some embodiments, the set of contacts 620 has a U-shape. In some embodiments, the set of contacts 620 has one or more of a L-shape similar to a set of contacts 320 of FIGS. 3A-3D, a W-shape similar to a set of contacts 700A' of FIG. 7A, a T-shape similar to a set of contacts 700B' of FIG. 7B, an O-shape (not shown), or the like. Other shapes or numbers of portions in the set of contacts 620 (FIGS. 6A-6D) are within the scope of the present disclosure.

The set of contacts 620 includes contact portions 620a, 620b and 620c. At least one of contact portions 620a, 620b or 620c of the set of contacts 620 is similar to at least one of contact portions 320a or 320b of the set of contacts 320, and similar detailed description is therefore omitted. The set of contacts 620 is located on the third level.

At least one of the contact portions of the set of contacts 620 overlaps at least one of the set of active regions 602 or at least one of the set of contacts 610. In some embodiments, the set of contacts 620 overlaps the set of gates 604.

Contact portion 620a and 620c of the set of contacts 620 extend in the second direction Y. Contact portion 620a and 620c are separated from each other in the first direction X. Contact portion 620b of the set of contacts 620 extends in the first direction X. In some embodiments, contact portions 620a, 620b and 620c are part of the same continuous contact structure. In some embodiments, the set of contacts 620 includes two or more separate or discontinuous contact portions that are separated from each other in at least the first direction X or the second direction Y.

Contact portion 620a of the set of contacts 620 overlaps contact 610m of the set of contacts 610 and an insulating region 662. Contact portion 620a overlaps active regions 602b8 and 602a8. In some embodiments, contact portion 620a is directly coupled to contact 610m of the set of contacts 610. In some embodiments, contact portion 620a is electrically coupled to active region 602b8 by contact 610m. In some embodiments, contact portion 620a is electrically isolated from active region 602a8 by the insulating region 662.

Contact portion 620b of the set of contacts 620 overlaps contact 610d of the set of contacts 610 and insulating regions 660 and 662. Contact portion 620b overlaps active regions 602a6, 602a7 and 602a8. In some embodiments, contact portion 620b is directly coupled to contact 610d of the set of contacts 610. In some embodiments, contact portion 620b is electrically coupled to active region 602a7 by contact 610d. In some embodiments, contact portion 620b is electrically isolated from active region 602a6 by the insulating region 660. In some embodiments, contact portion 620b is electrically isolated from active region 602a8 by the insulating region 662.

Contact portion 620c of the set of contacts 620 overlaps contact 610k of the set of contacts 610 and an insulating region 660. Contact portion 620c overlaps active regions 602b6 and 602a6. In some embodiments, contact portion 620c is directly coupled to contact 610k of the set of contacts 610. In some embodiments, contact portion 620c is electrically coupled to active region 602b6 by contact 610k. In some embodiments, contact portion 620c is electrically isolated from active region 602a6 by the insulating region 660.

Other configurations, arrangements on other levels or quantities of contacts in the set of contacts 620 are within the scope of the present disclosure. For example, in some embodiments, contact portion 620a, contact portion 620b or other contacts similar to contact portion 620a or 620b in the set of contacts 620 overlap or extend over at least another contact in the MD1 level or a gate in the POLY level of integrated circuit 300 or 600 (FIGS. 6A-6D).

The set of conductive structures 630 includes at least conductive structure 630a or 630b. In some embodiments, conductive structure 630a, 630b is similar to corresponding conductive structure 330a, 330b, and similar detailed description is therefore omitted.

The set of conductive structures 630 overlap at least the set of contacts 610 or 620 or the set of gates 604. The set of conductive structures 630 are over the set of active regions 602. In some embodiments, the set of conductive structures 630 are configured to provide an electrical connection from at least an active region of the set of active regions 602 or a gate of the set of gates 604 to at least another active region of the set of active regions 602 or gate of the set of gates 604.

Conductive structure 630a overlaps contacts 610b and 610c, contact portion 620b and insulating region 660. Conductive structure 630a is over active regions 602a3, 602a4, 602a5 and 602a6. In some embodiments, conductive structure 630a extends between gates 604c and 604g.

Conductive structure 630b overlaps contacts 610f, 610g, 610h, 610i, 610j, 610g, 610h, 610i, 610j, 610k, 610l, 610m and 610n, contact portions 620a and 620c, and at least gate 604a, 604b, 604c, 604d, 604e, 604f, 604g, 604h, 604i or 604j. Conductive structure 630b is over the sub-set of active regions 602b. Conductive structure 630b is over active regions 602b1, 602b2, 602b3, 602b4, 602b5, 602b6, 602b7, 602b8 and 602b9. In some embodiments, conductive structure 630b extends from gate 604a to gate 604j.

Other configurations, arrangements on other levels or quantities of structures in the set of conductive structures 630 are within the scope of the present disclosure.

Set of power rails 632 includes at least power rail 632a or 632b. In some embodiments, power rails 632a, 632b are similar to corresponding power rails 632a, 632b, and similar detailed description is therefore omitted. Other configurations, arrangements on other levels or quantities of power rails in the set of power rails 632 are within the scope of the present disclosure.

Set of vias 640 includes at least via layout pattern 640a, 640b, 640c, 640d, 640e, 640f, 640g, 640h, 640i, 640j, 640k or 640l. At least one of vias 640a, 640b, 640c, 640d, 640e, 640f, 640g, 640h, 640i, 640j, 640k or 640l of the set of vias 640 is similar to at least one of vias 340a, 340b, 340c, 340d, 340e, 340f, 340g, 340h or 340i of the set of vias, and similar detailed description is therefore omitted. In some embodiments, the set of vias 560 includes other members (not shown for ease of illustration).

Vias 640a, 640c and 640e are between power rail 632a and corresponding contacts 610a, 610c and 610e, and thereby provides an electrical connection between power rail 632a and corresponding contacts 610a, 610c and 610e. Vias 640g and 640i are between power rail 632b and corresponding contacts 610g and 610i, and thereby provides an electrical connection between power rail 632b and corresponding contacts 610g and 610i.

Via 640b is between conductive structure 630a and contact 610b, and thereby provides an electrical connection between conductive structure 630a and contact 610b.

Via 640d is between conductive structure 630a and contact portion 620b and thereby provides an electrical connection between conductive structure 630a and contact portion 620b.

Vias 640f, 640h, 640j, 640k and 640l are between conductive structure 630b and corresponding contacts 610f, 610h, 610j, 610l and 610n, and thereby provides an electrical connection between conductive structure 630b and corresponding contacts 610f, 610h, 610j, 610l and 610n.

In some embodiments, at least via 640a, 640b, 640c, 640e, 640f, 640g, 640h, 640i, 640j, 640k or 640l of the set of vias 640 are positioned at the VDT level. In some embodiments, via 640d of the set of vias 640 are positioned at the VD level. In some embodiments, a height of at least via 640a, 640b, 640c, 640e, 640f, 640g, 640h, 640i, 640j, 640k or 640l of the set of vias 640 is the same as a height of at least another via of via 640a, 640b, 640c, 640e, 640f, 640g, 640h, 640i, 640j, 640k or 640l of the set of vias 640. In some embodiments, a height in the third direction Z of at least via 640a, 640b, 640c, 640e, 640f, 640g, 640h, 640i, 640j, 640k or 640l of the set of vias 640 is different from a height in the third direction Z of via 640d of the set of vias 640.

Other configurations, arrangements on other levels or quantities of patterns in the set of vias 640 are within the scope of the present disclosure.

In some embodiments, the active region 602b2 (e.g., source of PMOS transistors P2 and P4 of FIG. 4) and the active region 602b4 (e.g., the source of PMOS transistor P6 and P8 of FIG. 4) are electrically coupled to the reference voltage supply VSS. For example, in some embodiments, active region 602b2, 602b4 is electrically coupled to corresponding contact 610g, 610i of the set of contacts 610, and corresponding contact 610g, 610i is electrically coupled to power rail 632b of the set of power rails 632 by corresponding via 640g, 640i of the set of vias 640. In some embodiments, power rail 632b is coupled to voltage supply VDD.

In some embodiments, the active region 602a1 (e.g., the source of NMOS transistor N4 of FIG. 4), the active region 602a5 (e.g., the source of NMOS transistors N2 and N4 of FIG. 4) and the active region 602a9 (e.g., the source of NMOS transistor N6 of FIG. 4) are electrically coupled to the reference voltage supply VSS. For example, in some embodiments, active region 602a1, 602a5, 602a9 is electrically coupled to corresponding contact 610a, 610c, 610e of the set of contacts 610, and corresponding contact 610a, 610c, 610e is electrically coupled to power rail 632a of the set of power rails 632 by corresponding via 640a, 640c, 640e of the set of vias 640. In some embodiments, power rail 632a is coupled to the reference voltage supply VSS.

In some embodiments, at least conductive structure 630b of the set of conductive structures 630 is configured to provide an electrical connection between at least a drain of PMOS transistor P4, a drain of PMOS transistors P2 and P6, a source of PMOS transistor P3 and a drain of PMOS transistor P8, a source of PMOS transistors P1 and P5, and a source of PMOS transistor P7. For example, in some embodiments, the active region 602b1 corresponds to the drain of PMO transistor P4, the active region 602b3 corresponds to the drain of PMOS transistors P2 and P6, the active region 602b5 corresponds to the source of PMOS transistor P3 and the drain of PMOS transistor P8, the active region 602b7 corresponds to the source of PMOS transistors P1 and P5, the active region 602b9 corresponds to the source of PMOS transistor P7, and are electrically coupled together by at least conductive structure 630b. In some embodiments, active region 602b1, 602b3, 602b5, 602b7, 602b9 is electrically coupled to corresponding contact 610f, 610h, 610j, 610l, 610n of the set of contacts 610, and corresponding contact 610f, 610h, 610j, 610l, 610n of the set of contacts 610 is electrically coupled to conductive structure 630b by corresponding vias 640f, 640h, 640j, 640k, 640l of the set of vias 640.

In some embodiments, at least contact portions 620a, 620b and 620c of the set of contacts 620 are configured to provide an electrical connection between each of the drain of PMOS transistors P1 and P3, the drain of PMOS transistors P5 and P7, and the drain of NMOS transistors N1 and N5. For example, in some embodiments, the active region 602b6 corresponds to the drain of PMOS transistors P1 and P3, the active region 602b8 corresponds to the drain of PMOS transistors P5 and P7, and the active region 602a7 corresponds to the drain of NMOS transistors N1 and N5, and are electrically coupled together by at least contact portions 620a, 620b and 620c of the set of contacts 620.

For example, in some embodiments, contact portions 620a, 620b and 620c of the set of contacts 620 are electrically coupled to contact 610m of the set of contacts 610, and contact 610m of the set of contacts 610 is electrically coupled to active region 602b8.

For example, in some embodiments, contact portions 620a, 620b and 620c of the set of contacts 620 are electrically coupled to contact 610k of the set of contacts 610, and contact 610k of the set of contacts 610 is electrically coupled to active region 602b6.

For example, in some embodiments, contact portions 620a, 620b and 620c of the set of contacts 620 are electrically coupled to contact 610d of the set of contacts 610, and contact 610d of the set of contacts 610 is electrically coupled to active region 602a7. In some embodiments, contact portions 620a, 620b and 620c of the set of contacts 620 are further electrically coupled to conductive structure 630a of the set of conductive structures 630 by via 640d of the set of vias 640, conductive structure 630a is electrically coupled to contact 610b by via 640b of the set of vias 640, and contact 610b of the set of contacts 610 is electrically coupled to active region 602a3.

In some embodiments, contact portions 620a and 620b of the set of contacts 620 are electrically insulated (e.g., not electrically coupled) with active region 602a6 by insulating region 660, and therefore active regions 602b6, 602b8 and 602a7 are electrically insulated (e.g., not electrically coupled) with active region 602a6 by at least insulating region 660.

In some embodiments, contact portions 620b and 620c of the set of contacts 620 are electrically insulated (e.g., not electrically coupled) with active region 602a8 by insulating region 662, and therefore active regions 602b6, 602b8 and 602a7 are electrically insulated (e.g., not electrically coupled) with active region 602a8 by at least insulating region 662.

In some embodiments, by at least providing an electrical connection between active regions 602b6, 602b8 and 602a7 of the set of active regions 602 using contact portions 620a, 620b and 620c of the set of contacts 620 in the MD2 layer, or electrically insulating active regions 602a6 and 602a8 from active regions 602b6, 602b8 and 602a7 using insulating regions 660 and 662, other metallization levels (e.g., M0, M1, etc.) can be utilized for additional routing resources resulting in integrated circuit 600 having at least a reduced pitch, a smaller area or a smaller standard cell than other approaches.

Layout Design of an Integrated Circuit

FIG. 7A is a diagram of a layout design 700A of a set of contacts 700A' of an integrated circuit, in accordance with some embodiments.

FIG. 7B is a diagram of a layout design 700B of a set of contacts 700B' of an integrated circuit, in accordance with some embodiments.

Layout designs 700A and 700B are usable to manufacture the set of contacts 700A' and 700B'. Layout designs 700A and 700B are usable to manufacture the set of contacts 320 or 620 of corresponding integrated circuit 300 or 600.

Layout design 700A is a variation of the set of metal over diffusion layout patterns 220 (FIG. 2) or 520 (FIG. 5). In comparison with the set of metal over diffusion layout patterns 520 of FIG. 5, layout design 700A has a W-shape. In comparison with the set of metal over diffusion layout patterns 520 of FIG. 5, layout design 700A further includes metal over diffusion layout pattern 720a.

In some embodiments, metal over diffusion layout patterns 720a and 720b are usable to manufacture corresponding contact portions 720a' and 720b' of the corresponding set of contacts 700A' and 700B'.

In some embodiments, metal over diffusion layout pattern 720a extends in the second direction Y. In some embodiments, metal over diffusion layout pattern 720a has a same length in the second direction Y as a length in the second direction Y of metal over diffusion layout pattern 520a or 520c. In some embodiments, metal over diffusion layout pattern 720a contacts metal over diffusion layout pattern 520b. In some embodiments, metal over diffusion layout pattern 720a contacts a midpoint of metal over diffusion layout pattern 520b in the second direction Y. In some embodiments, metal over diffusion layout patterns 520a, 520b and 720a are portions of a same continuous layout pattern (e.g., layout design 700A).

Layout design 700B is a variation of the set of metal over diffusion layout patterns 220 (FIG. 2) or 520 (FIG. 5). In comparison with the set of metal over diffusion layout patterns 220 of FIG. 2, layout design 700B has a T-shape. In comparison with the set of metal over diffusion layout patterns 220 of FIG. 2, metal over diffusion layout pattern 720b replaces metal over diffusion layout pattern 220a.

In comparison with metal over diffusion layout pattern 220a of FIG. 2, metal over diffusion layout pattern 720b is shifted in the second direction Y from metal over diffusion layout pattern 220a, and is rotated about the X-axis from metal over diffusion layout pattern 220a.

In some embodiments, metal over diffusion layout pattern 720b extends in the second direction Y. In some embodiments, metal over diffusion layout pattern 720b contacts metal over diffusion layout pattern 220b. In some embodiments, metal over diffusion layout pattern 720b contacts a midpoint of metal over diffusion layout pattern 220b in the second direction Y. In some embodiments, metal over diffusion layout patterns 220b and 720b are portions of a same continuous layout pattern (e.g., layout design 700B).

FIG. 7A is a top view of a diagram of a set of contacts 700A' of an integrated circuit, in accordance with some embodiments.

FIG. 7B is a top view of a diagram of a set of contacts 700B' of an integrated circuit, in accordance with some embodiments.

Structural relationships including alignment, lengths and widths, as well as configurations of set of contacts 700A' or 700B' of corresponding FIGS. 7A-7B are similar to the structural relationships and configurations of corresponding layout design 700A or 700B of corresponding FIGS. 7A-7B, and similar detailed description will not be described in FIGS. 3A-3D for brevity.

Set of contacts 700A' or 700B' is a variation of the set of contacts 320 (FIGS. 3A-3D) or 620 (FIGS. 6A-6D). In comparison with the set of contacts 320 (FIGS. 3A-3D) or 620 (FIGS. 6A-6D), set of contact 700A' has a W-shape. In comparison with the set of contacts 620 of FIGS. 6A-6D, set of contacts 700A' further includes contact portion 720a'.

In comparison with the set of contacts 320 (FIGS. 3A-3D) or 620 (FIGS. 6A-6D), set of contact 700B' has a T-shape. In comparison with the set of contacts 320 of FIGS. 3A-3D, contact portion 720b' of the set of contacts 700B' replaces contact portion 320a.

Other shapes in layout design 700A or 700B or the set of contacts 700A' or 700B' are within the scope of the present disclosure.

FIG. 8 is a flowchart of a method 800 of forming or manufacturing an integrated circuit in accordance with some embodiments. It is understood that additional operations may be performed before, during, and/or after the method 800 depicted in FIG. 8, and that some other operations may only be briefly described herein. In some embodiments, the method 800 is usable to form integrated circuits, such as at least integrated circuit 100 (FIG. 1), 300 (FIGS. 3A-3D), 400 (FIG. 4), 600 (FIGS. 6A-6D), or an integrated circuit portion, such as at least set of contacts 700A' (FIG. 7A) or 700B' (FIG. 7B). In some embodiments, the method 800 is usable to form integrated circuits having similar structural relationships as one or more of layout design 200 (FIG. 2), 500 (FIG. 5), 700A (FIG. 7A) or 700B (FIG. 7B).

In operation 802 of method 800, a layout design of an integrated circuit is generated. Operation 802 is performed by a processing device (e.g., processor 1002 (FIG. 10)) configured to execute instructions for generating a layout design. In some embodiments, the layout design of method 800 includes one or more of layout design 200, 500, 800 or 700A-700B. In some embodiments, the layout design of the present application is in a graphic database system (GDSII) file format.

In operation 804 of method 800, the integrated circuit is manufactured based on the layout design. In some embodiments, the integrated circuit of method 800 includes one or more of integrated circuit 100, 300, 400 or 600. In some embodiments, the integrated circuit of method 800 includes one or more of an integrated circuit portion, such as at least set of contacts 700A' or 700B'. In some embodiments, operation 804 of method 800 comprises manufacturing at least one mask based on the layout design, and manufacturing the integrated circuit based on the at least one mask.

Figure 9:
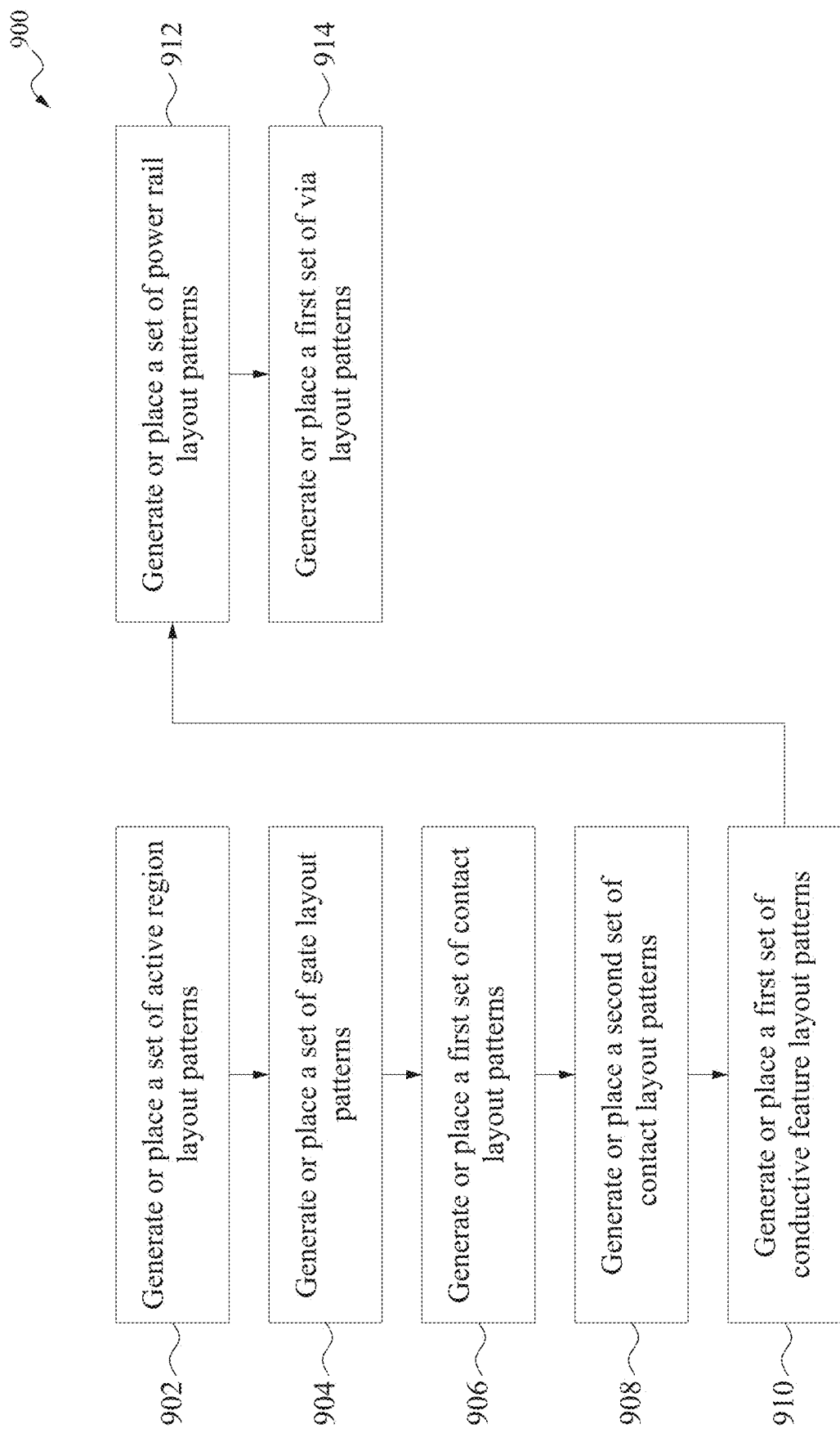
FIG. 9 is a flowchart of a method of generating a layout design of an integrated circuit, in accordance with some embodiments.

FIG. 9 is a flowchart of a method 900 of generating a layout design of an integrated circuit, in accordance with some embodiments. It is understood that additional operations may be performed before, during, and/or after the method 900 depicted in FIG. 9, and that some other processes may only be briefly described herein. In some embodiments, method 900 is an embodiment of operation 802 of method 800. In some embodiments, the method 900 is usable to generate one or more layout patterns of layout design 200 (FIG. 2) or 500 (FIG. 5) of an integrated circuit, such as integrated circuit 100 (FIG. 1), 300 (FIGS. 3A-3D), 400 (FIG. 4) or 600(FIGS. 6A-6D). In some embodiments, the method 900 is usable to generate one or more layout patterns of layout design 700A (FIG. 7A) or 700B (FIG. 7B) of an integrated circuit portion, such as at least set of contacts 700A' (FIG. 7A) or 700B' (FIG. 7B).

In operation 902 of method 900, a set of active region layout patterns is generated or placed on layout design 200 or 500. In some embodiments, the set of active region layout patterns of method 900 includes at least portions of one or more layout patterns of the set of active region layout patterns 202 or 502.

In some embodiments, operation 902 includes generating or placing a first set of active region layout patterns corresponding to fabricating a first set of active regions of the integrated circuit, and generating or placing a second set of active region layout pattern corresponding to fabricating a second set of active regions of the integrated circuit. In some embodiments, the first set of active region layout patterns or the second set of active region layout patterns of operation 902 includes at least portions of one or more layout patterns of the set of active region layout patterns 202 or 502. In some embodiments, at least the first set of active regions or the second set of active regions of operation 902 includes at least portions of one or more active regions of the set of active regions 302 or 602.

In operation 904 of method 900, a set of gate layout patterns is generated or placed on layout design 200 or 500. In some embodiments, the set of gate layout patterns of method 900 includes at least portions of one or more layout patterns of the set of gate layout patterns 204 or 504. In some embodiments, the set of gate layout patterns of method 900 correspond to fabricating a set of gates.

In some embodiments, operation 904 includes at least generating or placing a first gate layout pattern corresponding to fabricating a first gate or generating or placing a second gate layout pattern corresponding to fabricating a second gate. In some embodiments, the first gate layout pattern or the second gate layout pattern of operation 904 includes at least portions of one or more layout patterns of the set of gate layout patterns 204 or 504. In some embodiments, the first gate or the second gate of operation 904 includes at least portions of one or more gates of the set of gates 304 or 604.

In operation 906 of method 900, a first set of contact layout patterns is generated or placed on layout design 200 or 500. In some embodiments, the first set of contact layout patterns of method 900 includes at least portions of one or more layout patterns of the set of metal over diffusion layout patterns 210 or 510, set of metal over diffusion layout patterns 220 or 520 or layout design 700A-700B. In some embodiments, the first set of contact layout patterns of method 900 correspond to fabricating a first set of contacts.

In some embodiments, operation 906 includes at least generating or placing a first contact layout pattern corresponding to fabricating a first contact or generating or placing a second contact layout pattern corresponding to fabricating a second contact. In some embodiments, the first contact layout pattern or the second contact layout pattern of operation 906 includes at least portions of one or more layout patterns of the set of metal over diffusion layout patterns 210 or 510, or set of metal over diffusion layout patterns 220 or 520. In some embodiments, the first contact layout pattern or the second contact layout pattern of operation 906 includes at least portions of one or more layout patterns of layout design 700A or 700B. In some embodiments, the first contact or the second contact of operation 906 includes at least portions of one or more contacts of the set of contacts 310 or 610 or set of contacts 320, 620, 700A' or 700B'.

In operation 908 of method 900, a second set of contact layout patterns is generated or placed on layout design 200 or 500. In some embodiments, the second set of contact layout patterns of method 900 includes at least portions of one or more layout patterns of the set of metal over diffusion layout patterns 220 or 520, set of metal over diffusion layout patterns 210 or 510, or layout design 700A-700B. In some embodiments, the second set of contact layout patterns of method 900 correspond to fabricating a second set of contacts.

In some embodiments, operation 908 includes at least generating or placing a third contact layout pattern corresponding to fabricating a third contact or generating or placing a fourth contact layout pattern corresponding to fabricating a fourth contact. In some embodiments, the third or fourth contact layout pattern of operation 908 includes at least portions of one or more layout patterns of the set of metal over diffusion layout patterns 220 or 520 or set of metal over diffusion layout patterns 210 or 510. In some embodiments, the third or fourth contact of operation 908 includes at least portions of one or more contacts of the set of contacts 320, 620, 700A' or 700B' or set of contacts 310 or 610.

In operation 910 of method 900, a first set of conductive feature layout patterns is generated or placed on layout design 200 or 500. In some embodiments, the first set of conductive feature layout patterns of method 900 includes at least portions of one or more layout patterns of the set of conductive feature layout patterns 230 or 530. In some embodiments, the first set of conductive feature layout patterns of method 900 correspond to fabricating a first set of conductive structures.

In some embodiments, operation 910 includes generating or placing a first conductive structure layout pattern corresponding to fabricating a first conductive structure. In some embodiments, the first conductive structure layout pattern of operation 910 includes at least portions of one or more layout patterns of the set of conductive structure layout patterns 230 or 530. In some embodiments, the first conductive structure of operation 910 includes at least portions of one or more conductive structures of the set of conductive structures 330 or 630.

In operation 912 of method 900, a set of power rail layout patterns is generated or placed on layout design 200 or 500. In some embodiments, the set of power rail layout patterns of method 900 includes at least portions of one or more layout patterns of the set of power rail layout patterns 232 or 532.

In some embodiments, operation 912 includes at least generating or placing a first power rail layout pattern corresponding to fabricating a first power rail, or generating or placing a second power rail layout pattern corresponding to fabricating a second power rail. In some embodiments, the first power rail layout pattern of operation 912 includes at least portions of one or more layout patterns of the set of power rail layout patterns 232 or 532. In some embodiments, the second power rail layout pattern of operation 912 includes at least portions of one or more layout patterns of the set of power rail layout patterns 232 or 532. In some embodiments, the first power rail of operation 912 includes at least portions of one or more power rails of the set of power rails 332 or 632. In some embodiments, the second power rail of operation 912 includes at least portions of one or more power rails of the set of power rails 332 or 632.

In operation 914 of method 900, a set of via layout patterns is generated or placed on layout design 200 or 500. In some embodiments, the set of via layout patterns of method 900 includes at least portions of one or more layout patterns of the set of via layout patterns 240 or 540. In some embodiments, the set of via layout patterns of method 900 correspond to fabricating a set of vias.

In some embodiments, operation 914 includes at least generating or placing a via layout pattern corresponding to a first via or generating or placing a second via layout pattern corresponding to a second via. In some embodiments, the first or the second via layout pattern of operation 914 includes at least portions of one or more layout patterns of the set of via layout patterns 240 or 540. In some embodiments, the first or the second via of operation 914 includes at least portions of one or more vias of the set of vias 340 or 640.

In some embodiments, one or more of operations 902, 904, 906, 908, 910, 912 or 914 is not performed. One or more of the operations of methods 800-900 is performed by a processing device configured to execute instructions for manufacturing an integrated circuit, such as at least integrated circuit 100, 300, 400 or 600, or at least set of contacts 700A' (FIG. 7A) or 700B' (FIG. 7B). In some embodiments, one or more operations of methods 800-900 is performed using a same processing device as that used in a different one or more operations of methods 800-900. In some embodiments, a different processing device is used to perform one or more operations of methods 800-900 from that used to perform a different one or more operations of methods 800-900.

Figure 10:
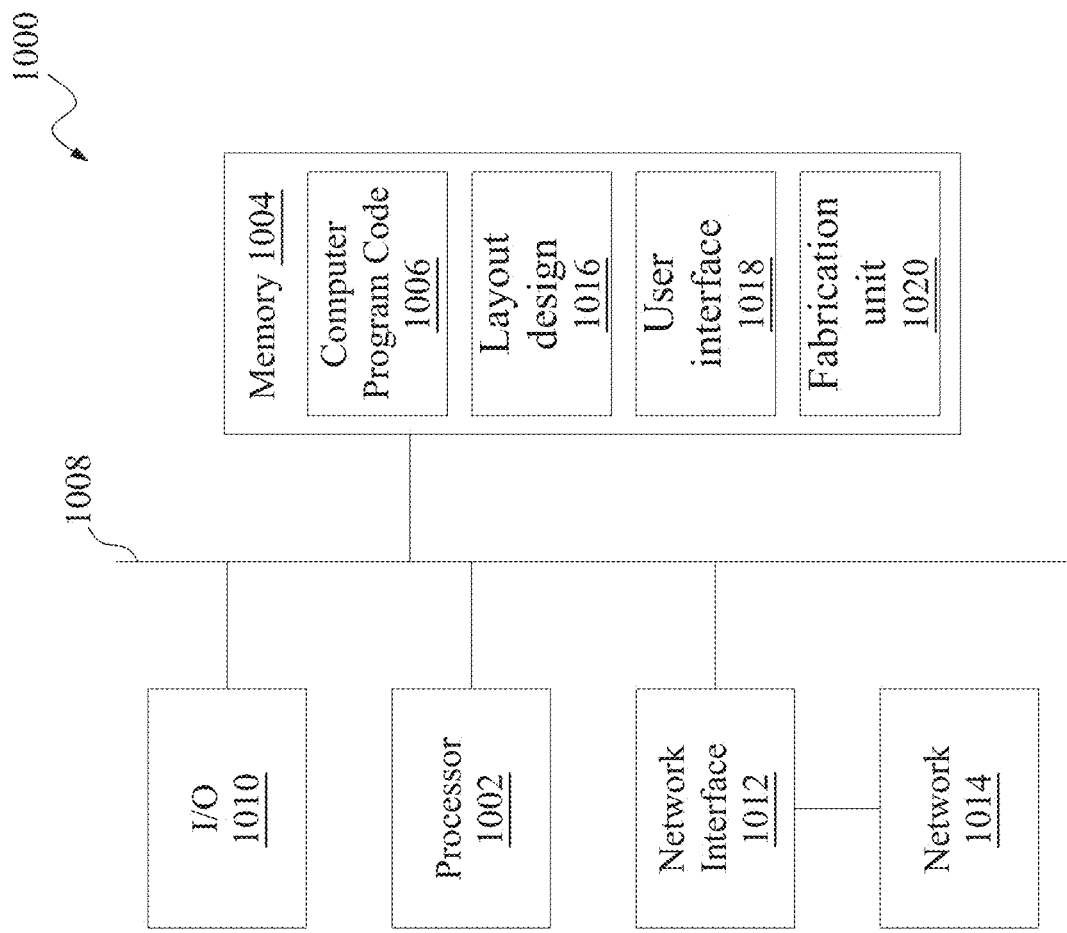
FIG. 10 is a block diagram of a system for designing and manufacturing an IC layout design, in accordance with some embodiments.

FIG. 10 is a block diagram of a system 1000 for designing and manufacturing an IC layout design, in accordance with some embodiments. In some embodiments, system 1000 generates or places one or more IC layout designs described herein. In some embodiments, system 1000 manufactures one or more ICs based on the one or more IC layout designs described herein. System 1000 includes a hardware processor 1002 and a non-transitory, computer readable storage medium 1004 encoded with, i.e., storing, the computer program code 1006, i.e., a set of executable instructions. Computer readable storage medium 1004 is configured for interfacing with manufacturing machines for producing the integrated circuit. The processor 1002 is electrically coupled to the computer readable storage medium 1004 by a bus 1008. The processor 1002 is also electrically coupled to an I/O interface 1010 by bus 1008. A network interface 1012 is also electrically connected to the processor 1002 by bus 1008. Network interface 1012 is connected to a network 1014, so that processor 1002 and computer readable storage medium 1004 are capable of connecting to external elements via network 1014. The processor 1002 is configured to execute the computer program code 1006 encoded in the computer readable storage medium 1004 in order to cause system 1000 to be usable for performing a portion or all of the operations as described in method 800 or 900.

In some embodiments, the processor 1002 is a central processing unit (CPU), a multi-processor, a distributed processing system, an application specific integrated circuit (ASIC), and/or a suitable processing unit.

In some embodiments, the computer readable storage medium 1004 is an electronic, magnetic, optical, electromagnetic, infrared, and/or a semiconductor system (or apparatus or device). For example, the computer readable storage medium 1004 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 1004 includes a compact disk-read only memory (CD-ROM), a compact disk-read/write (CD-R/W), and/or a digital video disc (DVD).

In some embodiments, the storage medium 1004 stores the computer program code 1006 configured to cause system 1000 to perform method 800 or 900. In some embodiments, the storage medium 1004 also stores information needed for performing method 800 or 900 as well as information generated during performance of method 800 or 900, such as layout design 1016 and user interface 1018 and fabrication unit 1020, and/or a set of executable instructions to perform the operation of method 800 or 900. In some embodiments, layout design 1016 comprises one or more layout patterns of layout design 200, 500, 700A or 700B.

In some embodiments, the storage medium 1004 stores instructions (e.g., computer program code 1006) for interfacing with manufacturing machines. The instructions (e.g., computer program code 1006) enable processor 1002 to generate manufacturing instructions readable by the manufacturing machines to effectively implement method 800 or 900 during a manufacturing process.

System 1000 includes I/O interface 1010. I/O interface 1010 is coupled to external circuitry. In some embodiments, I/O interface 1010 includes a keyboard, keypad, mouse, trackball, trackpad, and/or cursor direction keys for communicating information and commands to processor 1002.

System 1000 also includes network interface 1012 coupled to the processor 1002. Network interface 1012 allows system 1000 to communicate with network 1014, to which one or more other computer systems are connected. Network interface 1012 includes wireless network interfaces such as BLUETOOTH, WIFI, WIMAX, GPRS, or WCDMA; or wired network interface such as ETHERNET, USB, or IEEE-13104. In some embodiments, method 800 or 900 is implemented in two or more systems 1000, and information such as layout design, user interface and fabrication unit are exchanged between different systems 1000 by network 1014.

System 1000 is configured to receive information related to a layout design through I/O interface 1010 or network interface 1012. The information is transferred to processor 1002 by bus 1008 to determine a layout design for producing an IC (e.g., integrated circuit 100, 300, 400 or 600) or a portion of an IC (e.g., conductive structure 700A' or 700B'). The layout design is then stored in computer readable medium 1004 as layout design 1016. System 1000 is configured to receive information related to a user interface through I/O interface 1010 or network interface 1012. The information is stored in computer readable medium 1004 as user interface 1018. System 1000 is configured to receive information related to a fabrication unit through I/O interface 1010 or network interface 1012. The information is stored in computer readable medium 1004 as fabrication unit 1020. In some embodiments, the fabrication unit 1020 includes fabrication information utilized by system 1000.

In some embodiments, method 800 or 900 is implemented as a standalone software application for execution by a processor. In some embodiments, method 800 or 900 is implemented as a software application that is a part of an additional software application. In some embodiments, method 800 or 900 is implemented as a plug-in to a software application. In some embodiments, method 800 or 900 is implemented as a software application that is a portion of an EDA tool. In some embodiments, method 800 or 900 is implemented as a software application that is used by an EDA tool. In some embodiments, the EDA tool is used to generate a layout design of the integrated circuit device. In some embodiments, the layout design is stored on a non-transitory computer readable medium. In some embodiments, the layout design is generated using a tool such as VIRTUOSO® available from CADENCE DESIGN SYSTEMS, Inc., or another suitable layout generating tool. In some embodiments, the layout design is generated based on a netlist which is created based on the schematic design. In some embodiments, method 800 or 900 is implemented by a manufacturing device to manufacture an integrated circuit using a set of masks manufactured based on one or more layout designs generated by system 1000. In some embodiments, system 1000 is a manufacturing device to manufacture an integrated circuit using a set of masks manufactured based on one or more layout designs of the present disclosure. In some embodiments, system 1000 of FIG. 10 generates layout designs of an IC that are smaller than other approaches. In some embodiments, system 1000 of FIG. 10 generates layout designs of an IC (e.g., integrated circuit 100, 300, 400 or 600) or a portion of an IC (e.g., at least set of contacts 700A' (FIG. 7A) or 700B' (FIG. 7B)) that occupy less area than other approaches.

Figure 11:
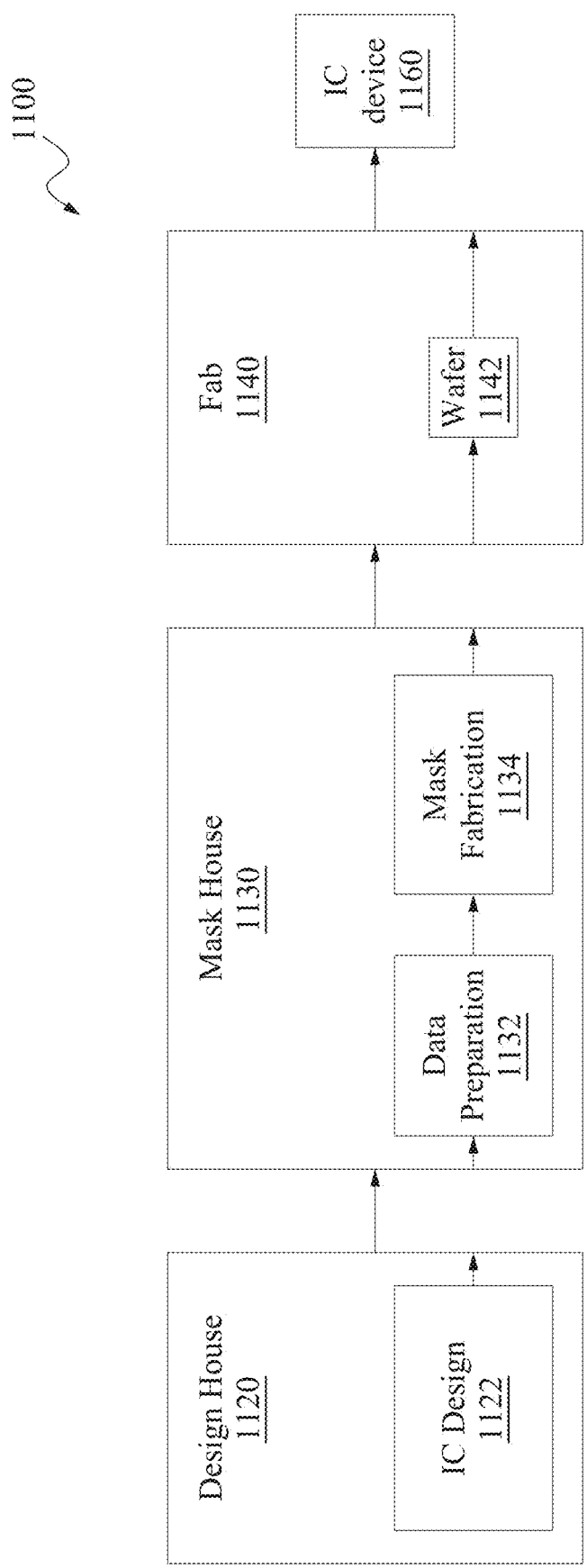
FIG. 11 is a block diagram of an IC manufacturing system, and an IC manufacturing flow associated therewith, in accordance with at least one embodiment of the present disclosure.

FIG. 11 is a block diagram of an integrated circuit (IC) manufacturing system 1100, and an IC manufacturing flow associated therewith, in accordance with at least one embodiment of the present disclosure.

In FIG. 11, IC manufacturing system 1100 includes entities, such as a design house 1120, a mask house 1130, and an IC manufacturer/fabricator ("fab") 1140, that interact with one another in the design, development, and manufacturing cycles and/or services related to manufacturing an IC device 1160. The entities in system 1100 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, one or more of design house 1120, mask house 1130, and IC fab 1140 is owned by a single larger company. In some embodiments, one or more of design house 1120, mask house 1130, and IC fab 1140 coexist in a common facility and use common resources.

Design house (or design team) 1120 generates an IC design layout 1122. IC design layout 1122 includes various geometrical patterns designed for an IC device 1160. The geometrical patterns correspond to patterns of metal, oxide, or semiconductor layers that make up the various components of IC device 1160 to be fabricated. The various layers combine to form various IC features. For example, a portion of IC design layout 1122 includes various IC features, such as an active region, gate electrode, source electrode and drain electrode, metal lines or vias of an interlayer interconnection, and openings for bonding pads, to be formed in a semiconductor substrate (such as a silicon wafer) and various material layers disposed on the semiconductor substrate. Design house 1120 implements a proper design procedure to form IC design layout 1122. The design procedure includes one or more of logic design, physical design or place and route. IC design layout 1122 is presented in one or more data files having information of the geometrical patterns. For example, IC design layout 1122 can be expressed in a GDSII file format or DFII file format.

Mask house 1130 includes data preparation 1132 and mask fabrication 1134. Mask house 1130 uses IC design layout 1122 to manufacture one or more masks to be used for fabricating the various layers of IC device 1160 according to IC design layout 1122. Mask house 1130 performs mask data preparation 1132, where IC design layout 1122 is translated into a representative data file ("RDF"). Mask data preparation 1132 provides the RDF to mask fabrication 1134. Mask fabrication 1134 includes a mask writer. A mask writer converts the RDF to an image on a substrate, such as a mask (reticle) or a semiconductor wafer. The design layout is manipulated by mask data preparation 1132 to comply with particular characteristics of the mask writer and/or requirements of IC fab 1140. In FIG. 11, mask data preparation 1132 and mask fabrication 1134 are illustrated as separate elements. In some embodiments, mask data preparation 1132 and mask fabrication 1134 can be collectively referred to as mask data preparation.

In some embodiments, mask data preparation 1132 includes optical proximity correction (OPC) which uses lithography enhancement techniques to compensate for image errors, such as those that can arise from diffraction, interference, other process effects and the like. OPC adjusts IC design layout 1122. In some embodiments, mask data preparation 1132 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1132 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 1134, which may undo part of the modifications performed by OPC in order to meet mask creation rules.

In some embodiments, mask data preparation 1132 includes lithography process checking (LPC) that simulates processing that will be implemented by IC fab 1140 to fabricate IC device 1160. LPC simulates this processing based on IC design layout 1122 to create a simulated manufactured device, such as IC device 1160. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout 1122.

It should be understood that the above description of mask data preparation 1132 has been simplified for the purposes of clarity. In some embodiments, data preparation 1132 includes additional features such as a logic operation (LOP) to modify the IC design layout according to manufacturing rules. Additionally, the processes applied to IC design layout 1122 during data preparation 1132 may be executed in a variety of different orders.

After mask data preparation 1132 and during mask fabrication 1134, a mask or a group of masks are fabricated based on the modified IC design layout. In some embodiments, an electron-beam (e-beam) or a mechanism of multiple e-beams is used to form a pattern on a mask (photomask or reticle) based on the modified IC design layout. The mask can be formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM. The mask(s) generated by mask fabrication 1134 is used in a variety of processes. For example, such a mask(s) is used in an ion implantation process to form various doped regions in the semiconductor wafer, in an etching process to form various etching regions in the semiconductor wafer, and/or in other suitable processes.

IC fab 1140 is an IC fabrication entity that includes one or more manufacturing facilities for the fabrication of a variety of different IC products. In some embodiments, IC Fab 1140 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry entity.

IC fab 1140 uses the mask (or masks) fabricated by mask house 1130 to fabricate IC device 1160. Thus, IC fab 1140 at least indirectly uses IC design layout 1122 to fabricate IC device 1160. In some embodiments, a semiconductor wafer 1142 is fabricated by IC fab 1140 using the mask (or masks) to form IC device 1160. Semiconductor wafer 1142 includes a silicon substrate or other proper substrate having material layers formed thereon. Semiconductor wafer further includes one or more of various doped regions, dielectric features, multilevel interconnects, and the like (formed at subsequent manufacturing steps).

System 1100 is shown as having design house 1120, mask house 1130 or IC fab 1140 as separate components or entities. However, it is understood that one or more of design house 1120, mask house 1130 or IC fab 1140 are part of the same component or entity.

Details regarding an integrated circuit (IC) manufacturing system (e.g., system 1100 of FIG. 16), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20100040838, published Feb. 6, 2014, and U.S. Pat. No. 7,260,442, granted Aug. 21, 2007, the entireties of each of which are hereby incorporated by reference.

One aspect of this description relates to an integrated circuit. In some embodiments, the integrated circuit includes a first active region, a second active region, a third active region, a first contact and a second contact. In some embodiments, the first active region and the second active region are in a substrate. In some embodiments, the first active region and the second active region are separated from each other in a first direction, and are located on a first level. In some embodiments, the third active region is in the substrate. In some embodiments, the third active region is located on the first level and is separated from the second active region in a second direction different from the first direction. In some embodiments, the first contact extends in the second direction, overlaps the first active region, and is located on a second level different from the first level. In some embodiments, the second contact extends in the first direction and the second direction, overlaps the first contact and the third active region, is electrically coupled to the first contact, and is located on a third level different from the first level and the second level. In some embodiments, the integrated circuit further includes a third contact that extends in the second direction, overlaps the third active region, is located on the second level, and is electrically coupled to the second contact. In some embodiments, the first active region corresponds to a drain of a first transistor of a first type, the second active region corresponds to a drain of a second transistor of the first type or a source of the first transistor of the first type, and the third active region corresponds to a drain or a source of a third transistor of a second type different from the first type. In some embodiments, the second contact includes a first portion that extends in the first direction, overlaps the first contact, the first active region and the second active region, and a second portion that extends in the second direction, is electrically coupled to the first portion, and overlaps the second active region and the third active region. In some embodiments, the integrated circuit further includes a first insulating region over the second active region. In some embodiments, the second active region is not electrically coupled to the second contact. In some embodiments, the integrated circuit further includes a fourth active region, a fifth active region, a third contact and a first insulating region. In some embodiments, the fourth active region is in the substrate. In some embodiments, the fourth active region is separated from the first active region in the first direction, and is located on the first level. In some embodiments, the fifth active region is in the substrate. In some embodiments, the fifth active region is located on the first level and is separated from the fourth active region in the second direction. In some embodiments, the third contact extends in the second direction, overlaps the fifth active region, and is located on the second level. In some embodiments, the first insulating region is over the fourth active region. In some embodiments, the second contact further includes a third portion that extends in the first direction, is separated from the first portion in the first direction, is electrically coupled to the first portion and the second portion, overlaps the fourth active region and the third contact. In some embodiments, the third active region is electrically coupled to the second contact, and the fourth active region is not electrically coupled to the second contact. In some embodiments, the integrated circuit is part of an AND OR INVERT logic circuit.

Another aspect of this description relates to an integrated circuit. In some embodiments, the integrated circuit includes a first set of active regions, a second set of active regions, a first set of contacts and a second set of contacts. In some embodiments, the first set of active regions is in a substrate. In some embodiments, the first set of active regions extends in a first direction, and is located on a first level. In some embodiments, the second set of active regions is in the substrate. In some embodiments, the second set of active regions extends in the first direction, is located on the first level, and is separated from the first set of active regions in a second direction different from the first direction. In some embodiments, the first set of contacts extends in the second direction, overlaps at least the first set of active regions or the second set of active regions, and is located on a second level different from the first level. In some embodiments, each of the contacts of the first set of contacts is separated from an adjacent contact of the first set of contacts in the first direction. In some embodiments, the first set of contacts is electrically coupled to at least the first set of active regions or the second set of active regions. In some embodiments, the second set of contacts extends in the first direction and the second direction, overlaps the first set of contacts, and is located on a third level different from the first level and the second level. In some embodiments, the second set of contacts is electrically coupled to a first contact of the first set of contacts. In some embodiments, the second set of contacts includes a second contact that includes a first portion and a second portion. In some embodiments, the first portion extends in the first direction, overlaps the first contact of the first set of contacts, a first active region and a second active region of the first set of active regions. In some embodiments, the first active region of the first set of active regions is electrically coupled to the first contact of the first set of contacts. In some embodiments, the second portion extends in the second direction, is electrically coupled to the first portion, and overlaps the second active region of the first set of active regions and a first active region of the second set of active regions. In some embodiments, the first set of contacts includes a third contact that extends in the second direction, overlaps and electrically coupled to the first active region of the second set of active regions, and is electrically coupled to the second contact. In some embodiments, the integrated circuit further includes an insulating region that is over the second active region of the first set of active regions. In some embodiments, the second contact is electrically isolated from the second active region of the first set of active regions. In some embodiments, the second contact has a L-shape, a U-shape, a T-shape or a W-shape. In some embodiments, the integrated circuit further includes a set of gates that extends in the second direction, overlaps the set of active regions, and is located on the second level. In some embodiments, each of the gates of the set of gates is separated from an adjacent gate of the set of gates in the first direction by a first pitch. In some embodiments, the integrated circuit further includes a first set of conductive structures that extends in at least the first direction, is located on a fourth level different from the first level, the second level and the third level, and at least overlaps the first set of contacts or the second set of contacts. In some embodiments, the integrated circuit further includes a first set of vias and a second set of vias. In some embodiments, the first set of vias couple the first set of conductive structures to the first set of contacts. In some embodiments, the first set of vias is between the first set of conductive structures and the first set of contacts. In some embodiments, a via of the first set of vias is located where a conductive structure of the first set of conductive structures overlaps the first contact of the first set of contacts. In some embodiments, the second set of vias couple the first set of conductive structures to the second set of contacts. In some embodiments, the second set of vias is between the first set of conductive structures and the second set of contacts. In some embodiments, a via of the second set of vias is located where another conductive structure of the first set of conductive structures overlaps a second contact of the second set of contacts. In some embodiments, the integrated circuit further includes a set of power rails and a first set of vias. In some embodiments, the set of power rails extends in at least the first direction, is located on a fourth level different from the first level, the second level and the third level, and overlaps the first set of contacts. In some embodiments, the first set of vias couple the set of power rails to the first set of contacts. In some embodiments, the first set of vias is between the set of power rails and the first set of contacts. In some embodiments, a via of the first set of vias is located where a power rail of the set of power rails overlaps a second contact of the first set of contacts.

Still another aspect of this description relates to a method of forming an integrated circuit. In some embodiments, the method includes generating, by a processor, a cell layout design of the integrated circuit, and manufacturing the integrated circuit based on the cell layout design. In some embodiments, generating of the cell layout design includes generating a set of active region layout patterns that extends in a first direction, is located on a first layout level, and is separated from one another in a second direction different from the first direction. In some embodiments, the set of active regions layout patterns correspond to fabricating a set of active regions in a substrate. In some embodiments, generating of the cell layout design further includes generating a set of gate layout patterns that extends in the second direction, overlaps the set of active region layout patterns, and is located on a second layout level different from the first layout level. In some embodiments, each of the gate layout patterns of the set of gate layout patterns is separated from an adjacent gate layout pattern of the set of gate layout patterns in the first direction. In some embodiments, the set of gate layout patterns correspond to fabricating a set of gates. In some embodiments, generating of the cell layout design further includes generating a first set of contact layout patterns that extends in the second direction, overlaps the set of active region layout patterns, and is located on the second layout level. In some embodiments, each of the contact layout patterns of the first set of contact layout patterns is separated from an adjacent contact of the first set of contact layout patterns in the first direction. In some embodiments, the first set of contact layout patterns correspond to fabricating a first set of contacts. In some embodiments, the first set of contacts is electrically coupled to the set of active regions. In some embodiments, generating of the cell layout design further includes generating a second set of contact layout patterns that extends in the first direction and the second direction, overlaps the first set of contact layout patterns, and is located on a third layout level different from the first layout level and the second layout level. In some embodiments, the second set of contact layout patterns correspond to fabricating a second set of contacts. In some embodiments, the second set of contacts is electrically coupled to the first set of contacts. In some embodiments, generating of the cell layout design further includes generating a first set of conductive structure layout patterns that extends in the first direction or the second direction, overlaps the set of gate layout patterns, and is located on a fourth layout level different from the first layout level, the second layout level and the third layout level. In some embodiments, the set of first set of conductive structure layout patterns correspond to fabricating a first set of conductive structures. In some embodiments, generating of the cell layout design further includes generating a first set of via layout patterns that correspond to fabricating a first set of vias. In some embodiments, the first set of via layout patterns is between the first set of conductive structure layout patterns and the first set of contact layout patterns. In some embodiments, a via layout pattern of the first set of via layout patterns is located where a conductive structure layout pattern of the first set of conductive structure layout patterns overlaps a contact layout pattern of the first set of contact layout patterns. In some embodiments, the first set of vias couple the first set of conductive structures to the first set of contacts. In some embodiments, generating of the cell layout design further includes generating a second set of via layout patterns that correspond to fabricating a second set of vias. In some embodiments, the second set of via layout patterns is between the first set of conductive structure layout patterns and the second set of contact layout patterns. In some embodiments, a via layout pattern of the second set of via layout patterns is located where another conductive structure layout pattern of the second set of conductive structure layout patterns overlaps a contact layout pattern of the second set of contact layout patterns. In some embodiments, the second set of vias couple the first set of conductive structures to the second set of contacts.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. An integrated circuit comprising:
   a first active region and a second active region in a substrate, the first active region and the second active region being separated from each other in a first direction, and being located on a first level;
   a third active region in the substrate, the third active region being located on the first level and being sepa- rated from the second active region in a second direction different from the first direction;
a first contact extending in the second direction, overlapping the first active region, and being located on a second level different from the first level; and
a second contact extending in the first direction and the second direction, overlapping the first contact and the third active region, being electrically coupled to the first contact, and being located on a third level different from the first level and the second level.

2. The integrated circuit of claim 1, further comprising:
a third contact extending in the second direction, overlapping the third active region, being located on the second level, and being electrically coupled to the second contact.

3. The integrated circuit of claim 2, wherein
the first active region corresponds to a drain of a first transistor of a first type;
the second active region corresponds to a drain of a second transistor of the first type or a source of the first transistor of the first type; and
the third active region corresponds to a drain or a source of a third transistor of a second type different from the first type.

4. The integrated circuit of claim 1, wherein the second contact comprises:
a first portion extending in the first direction, overlapping the first contact, the first active region and the second active region; and
a second portion extending in the second direction, being electrically coupled to the first portion, and overlapping the second active region and the third active region.

5. The integrated circuit of claim 4, further comprising:
a first insulating region over the second active region, the second active region is not electrically coupled to the second contact.

6. The integrated circuit of claim 4, further comprising:
a fourth active region in the substrate, the fourth active region being separated from the first active region in the first direction, and being located on the first level;
a fifth active region in the substrate, the fifth active region being located on the first level and being separated from the fourth active region in the second direction;
a third contact extending in the second direction, overlapping the fifth active region, and being located on the second level; and
a first insulating region over the fourth active region.

7. The integrated circuit of claim 6, wherein the second contact further comprises:
a third portion extending in the second direction, being separated from the second portion in the second direction, being electrically coupled to the first portion and the second portion, overlapping the fourth active region and the third contact, the third active region being electrically coupled to the second contact, and the fourth active region not being electrically coupled to the second contact.

8. The integrated circuit of claim 1, wherein the integrated circuit is part of an AND OR INVERT logic circuit.

9. An integrated circuit comprising:
a first set of active regions in a substrate, the first set of active regions extending in a first direction, being located on a first level;
a second set of active regions in the substrate, the second set of active regions extending in the first direction, being located on the first level, and being separated from the first set of active regions in a second direction different from the first direction;
a first set of contacts extending in the second direction, overlapping at least the first set of active regions or the second set of active regions, and being located on a second level different from the first level, each of the contacts of the first set of contacts being separated from an adjacent contact of the first set of contacts in the first direction, the first set of contacts being electrically coupled to at least the first set of active regions or the second set of active regions; and
a second set of contacts extending in the first direction and the second direction, overlapping the first set of contacts, and being located on a third level different from the first level and the second level, the second set of contacts being electrically coupled to a first contact of the first set of contacts.

10. The integrated circuit of claim 9, wherein the second set of contacts comprises:
a second contact comprising:
a first portion extending in the first direction, overlapping the first contact of the first set of contacts, a first active region and a second active region of the first set of active regions, the first active region of the first set of active regions being electrically coupled to the first contact of the first set of contacts; and
a second portion extending in the second direction, being electrically coupled to the first portion, and overlapping the second active region of the first set of active regions and a first active region of the second set of active regions.

11. The integrated circuit of claim 10, wherein the first set of contacts comprises:
a third contact extending in the second direction, overlapping and electrically coupled to the first active region of the second set of active regions, and being electrically coupled to the second contact.

12. The integrated circuit of claim 11, further comprising:
an insulating region over the second active region of the first set of active regions, the second contact being electrically isolated from the second active region of the first set of active regions.

13. The integrated circuit of claim 10, wherein the second contact has a L-shape, a U-shape, a T-shape or a W-shape.

14. The integrated circuit of claim 9, further comprising:
a set of gates extending in the second direction, overlapping the first set of active regions and the second set of active regions, and being located on the second level, each of the gates of the set of gates being separated from an adjacent gate of the set of gates in the first direction by a first pitch.

15. The integrated circuit of claim 9, further comprising:
a first set of conductive structures extending in at least the first direction, being located on a fourth level different from the first level, the second level and the third level, and at least overlapping the first set of contacts or the second set of contacts.

16. The integrated circuit of claim 15, further comprising:
a first set of vias coupling the first set of conductive structures to the first set of contacts, the first set of vias being between the first set of conductive structures and the first set of contacts, and a via of the first set of vias being located where a conductive structure of the first set of conductive structures overlaps the first contact of the first set of contacts; and
a second set of vias coupling the first set of conductive structures to the second set of contacts, the second set of vias being between the first set of conductive structures and the second set of contacts, and a via of the second set of vias being located where another conductive structure of the first set of conductive structures overlaps a second contact of the second set of contacts.

17. The integrated circuit of claim 9, further comprising:
a set of power rails extending in at least the first direction, being located on a fourth level different from the first level, the second level and the third level, and overlapping the first set of contacts; and
a first set of vias coupling the set of power rails to the first set of contacts, the first set of vias being between the set of power rails and the first set of contacts, and a via of the first set of vias being located where a power rail of the set of power rails overlaps a second contact of the first set of contacts.

18. A method of forming an integrated circuit (IC), the method comprising:
generating, by a processor, a cell layout design of the integrated circuit, wherein the generating of the cell layout design comprises:
generating a set of active region layout patterns extending in a first direction, being located on a first layout level, and being separated from one another in a second direction different from the first direction, the set of active regions layout patterns corresponding to fabricating a set of active regions in a substrate;
generating a set of gate layout patterns extending in the second direction, overlapping the set of active region layout patterns, and being located on a second layout level different from the first layout level, each of the gate layout patterns of the set of gate layout patterns being separated from an adjacent gate layout pattern of the set of gate layout patterns in the first direction, the set of gate layout patterns corresponding to fabricating a set of gates;
generating a first set of contact layout patterns extending in the second direction, overlapping the set of active region layout patterns, and being located on the second layout level, each of the contact layout patterns of the first set of contact layout patterns being separated from an adjacent contact of the first set of contact layout patterns in the first direction, the first set of contact layout patterns corresponding to fabricating a first set of contacts, the first set of contacts being electrically coupled to the set of active regions; and
generating a second set of contact layout patterns extending in the first direction and the second direction, overlapping the first set of contact layout patterns, and being located on a third layout level different from the first layout level and the second layout level, the second set of contact layout patterns corresponding to fabricating a second set of contacts, the second set of contacts being electrically coupled to the first set of contacts; and
manufacturing the integrated circuit based on the cell layout design.

19. The method of claim 18, wherein generating of the cell layout design further comprises:
generating a first set of conductive structure layout patterns extending in the first direction or the second direction, overlapping the set of gate layout patterns, and being located on a fourth layout level different from the first layout level, the second layout level and the third layout level, and the first set of conductive structure layout patterns corresponding to fabricating a first set of conductive structures.

20. The method of claim 19, wherein generating of the cell layout design further comprises:
generating a first set of via layout patterns corresponding to fabricating a first set of vias, the first set of via layout patterns being between the first set of conductive structure layout patterns and the first set of contact layout patterns, and a via layout pattern of the first set of via layout patterns being located where a conductive structure layout pattern of the first set of conductive structure layout patterns overlaps a contact layout pattern of the first set of contact layout patterns, the first set of vias coupling the first set of conductive structures to the first set of contacts; and
generating a second set of via layout patterns corresponding to fabricating a second set of vias, the second set of via layout patterns being between the first set of conductive structure layout patterns and the second set of contact layout patterns, and a via layout pattern of the second set of via layout patterns being located where another conductive structure layout pattern of the first set of conductive structure layout patterns overlaps a contact layout pattern of the second set of contact layout patterns, the second set of vias coupling the first set of conductive structures to the second set of contacts.

* * * * *